United States Patent [19]

Satomura et al.

[11] Patent Number: 5,541,960

[45] Date of Patent: Jul. 30, 1996

[54] METHOD OF DETERMINING A SYSCHRONOUS SIGNAL PATTERN AND METHOD OF AND DEVICE FOR RECORDING THE SYNCHRONOUS SIGNAL PATTERN ON A MEDIUM

[75] Inventors: Seiichiro Satomura; Fumiyuki Mikami, both of Yokohama, Japan

[73] Assignee: Canon Kabushiki Kaisha, Tokyo, Japan

[21] Appl. No.: 476,048

[22] Filed: Jun. 7, 1995

Related U.S. Application Data

[63] Continuation of Ser. No. 886,935, May 22, 1992, abandoned.

[30] Foreign Application Priority Data

Dec. 3, 1991 [JP] Japan ................... 3-319075

[51] Int. Cl.⁶ ................. H04L 7/00; H04L 27/06
[52] U.S. Cl. ................ 375/368; 375/343; 369/59
[58] Field of Search .................. 375/340, 362, 375/368, 365, 343, 259, 354; 369/59; 360/53, 40

[56] References Cited

U.S. PATENT DOCUMENTS

| | | |
|---|---|---|
| 3,341,658 | 9/1967 | Kaneko . |
| 4,280,218 | 7/1981 | Gordy et al. ............... 371/6 |
| 4,697,277 | 9/1987 | van Rassel ............... 375/116 |
| 4,937,804 | 6/1990 | Ishihara .................. 369/48 |
| 5,031,193 | 7/1991 | Atkinson et al. ............ 375/96 X |
| 5,175,655 | 12/1992 | Satomura ................. 360/53 |
| 5,229,986 | 7/1993 | Mizokami et al. ........... 369/59 |
| 5,233,592 | 8/1993 | Suzuki et al. .............. 369/59 |

FOREIGN PATENT DOCUMENTS

| | | |
|---|---|---|
| 0096854 | 12/1983 | European Pat. Off. . |
| 0358581 | 3/1990 | European Pat. Off. . |
| 0420179 | 4/1991 | European Pat. Off. . |
| 0420211 | 4/1991 | European Pat. Off. . |
| 0431957 | 6/1991 | European Pat. Off. . |
| WO03516 | 10/1982 | WIPO . |

OTHER PUBLICATIONS

"Fault–Tolerant Sync Byte for Run–Length–Limited Codes," IBM Technical Disclosure Bulletin, vol. 29, No. 1, Jun. 1986, pp. 151 through 157.

"Enhanced Small Device Interface," IBM Technical Disclosure Bulletin, vol. 29, No. 8, Jan. 1987, pp. 3414 through 3416.

"Magnetic Recording vol. II Computer Data Storage" pp. 245–258, Denis Mee et al., McGraw–Hill.

*Primary Examiner*—Stephen Chin
*Assistant Examiner*—Tesfaldet Bocure
*Attorney, Agent, or Firm*—Fitzpatrick, Cella, Harper & Scinto

[57] ABSTRACT

Disclosed are methods of determining and recording a synchronous signal pattern on a medium and also an information recording/reproducing device thereof. The method of determining an optimum synchronous signal pattern includes detecting correlation properties of a VFO pattern and a synchronous signal pattern with a matching filter by inputting the respective samples of the patterns to the matching filter; and determining the sample exhibiting an excellent correlation property as the synchronous signal pattern among the samples. The information recording method includes forming information by sequencing the VFO pattern, the determined synchronous signal pattern and (2, 7)-modulated data; and recording the information on a recording medium. The information recording/reproducing device includes a device for recording, on a recording medium, the information configured by sequencing the VFO pattern, the synchronous signal pattern for identifying the head of information and (2, 7)-modulated data; and a device for reproducing the information. The VFO pattern consists of a repetitive pattern of "0000" or "100" or "010", and the synchronous signal pattern is a binary signal pattern.

24 Claims, 19 Drawing Sheets

FIG. 9A

```
00FB5B -- 0001 0000 0100 0000 1000 1000 0100 1000 1001 0010 0000 1000
023B5B -- 0001 0000 0100 0100 0000 1000 0100 1000 1001 0010 0000 1000
023BCB -- 0001 0000 0100 0100 0000 1000 0100 1000 1000 0010 0100 1000
02464F -- 0001 0000 0100 0100 1001 0000 0010 0000 1001 0000 1000 1000
028B1B -- 0001 0000 0100 0100 0100 0010 0100 1000 0001 0010 0000 1000
02C35B -- 0001 0000 0100 0100 1000 0001 0000 1000 1001 0010 0000 1000
02FB1B -- 0001 0000 0100 0100 1000 1000 0100 1000 0001 0010 0000 1000
03C8EF -- 0001 0000 0100 1000 1000 0010 0100 0000 1000 0100 1000 1000
06EA43 -- 0001 0000 0010 0000 1000 0100 0100 0100 1001 0000 0100 1000
06EACB -- 0001 0000 0010 0000 1000 0100 0100 1000 1000 0010 0100 1000
07435B -- 0001 0000 0010 0001 0001 0000 0100 1000 1001 0010 0000 1000
07D853 -- 0001 0000 0010 0010 0001 0010 0000 0100 1001 0001 0000 1000
08DBEB -- 0001 0010 0100 0000 1000 0010 0000 1000 1000 0100 0100 1000
08DBEF -- 0001 0010 0100 0000 1000 0010 0000 1000 1000 0100 1000 1000
0A00EF -- 0001 0010 0100 0100 0001 0000 0100 0000 1000 0100 1000 1000
0A03E3 -- 0001 0010 0100 0100 0001 0000 0100 1000 1000 0100 0000 1000
0A1BE3 -- 0001 0010 0100 0100 0001 0010 0000 1000 1000 0100 0000 1000
0AD87B -- 0001 0010 0100 0100 1000 0010 0000 0100 0010 0010 0000 1000
0ADB0F -- 0001 0010 0100 0100 1000 0010 0000 1000 0001 0000 1000 1000
0ADBE3 -- 0001 0010 0100 0100 1000 0010 0000 1000 1000 0100 0000 1000
0D499B -- 0001 0000 1000 1001 0001 0010 0100 0010 0000 0010 0000 1000
0E1F90 -- 0001 0000 1000 0100 0001 0010 0010 0010 0000 1001 0000 0100
0F08EF -- 0001 0000 1000 1000 0001 0010 0100 0000 1000 0100 1000 1000
10B63B -- 0001 0001 0000 0100 0100 1000 0010 0000 0100 1000 0100 1000
10B880 -- 0001 0001 0000 0100 0100 1000 0100 0010 0100 0001 0000 0100
10B990 -- 0001 0001 0000 0100 0100 1000 0100 0010 0000 1001 0000 0100
10D193 -- 0001 0001 0000 0100 1000 1001 0000 0010 0000 1001 0000 1000
10E202 -- 0001 0001 0000 0100 1000 0100 0010 0100 0001 0000 0100 0100
11BB6B -- 0001 0001 0000 0010 0000 1000 0100 1000 0010 0010 0100 1000
1286C3 -- 0001 0001 0010 0100 0100 0001 0010 0000 1000 0001 0000 1000
130A03 -- 0001 0001 0000 1000 0001 0010 0100 0100 0001 0000 0100 1000
130ADB -- 0001 0001 0000 1000 0001 0010 0100 0100 1000 0010 0000 1000
133B5B -- 0001 0001 0000 1000 0000 1000 0100 1000 1001 0010 0000 1000
13C23B -- 0001 0001 0000 1000 1000 0001 0010 0100 0000 1000 0100 1000
160093 -- 0001 0001 0010 0000 0100 0001 0000 0100 0100 1001 0000 1000
16043B -- 0001 0001 0010 0000 0100 0001 0001 0000 0100 1000 0100 1000
1611D3 -- 0001 0001 0010 0000 0100 1001 0000 0010 0001 0001 0000 1000
16136F -- 0001 0001 0010 0000 0100 1001 0000 1000 0010 0000 1000 1000
16B99B -- 0001 0001 0010 0010 0100 1000 0100 0010 0000 0010 0000 1000
16F64E -- 0001 0001 0010 0000 1000 1000 0010 0000 1001 0000 1000 0100
17160F -- 0001 0001 0010 0001 0000 1001 0010 0000 0100 0000 1000 1000
18024F -- 0001 0010 0000 0100 0001 0000 0100 0100 1001 0000 1000 1000
18034F -- 0001 0010 0000 0100 0001 0000 0100 1000 1001 0000 1000 1000
1810EB -- 0001 0010 0000 0100 0001 0001 0000 0100 1000 0100 0100 1000
181A6F -- 0001 0010 0000 0100 0001 0010 0010 0100 0010 0000 1000 1000
181EFB -- 0001 0010 0000 0100 0001 0010 0010 0000 1000 1000 0100 1000
187D23 -- 0001 0010 0000 0100 0010 0010 0001 0001 0010 0100 0000 1000
1886D3 -- 0001 0010 0000 0100 0100 0001 0010 0000 1000 1001 0000 1000
18DB4F -- 0001 0010 0000 0100 1000 0010 0000 1000 1001 0000 1000 1000
18DBEB -- 0001 0010 0000 0100 1000 0010 0000 1000 1000 0100 0100 1000
18EBDB -- 0001 0010 0000 0100 1000 0100 0100 1000 1000 0010 0000 1000
18F653 -- 0001 0010 0000 0100 1000 1000 0010 0000 1001 0001 0000 1000
18FA03 -- 0001 0010 0000 0100 1000 1000 0100 0100 0001 0000 0100 1000
18FADB -- 0001 0010 0000 0100 1000 1000 0100 0100 1000 0010 0000 1000
1A064F -- 0001 0010 0010 0100 0001 0000 0010 0000 1001 0000 1000 1000
1A07DB -- 0001 0010 0010 0100 0001 0000 0010 0010 0001 0010 0000 1000
1A10E3 -- 0001 0010 0010 0100 0001 0001 0000 0100 1000 0100 0000 1000
1A11DB -- 0001 0010 0010 0100 0001 0001 0000 0010 0001 0010 0000 1000
1A791B -- 0001 0010 0010 0100 0010 0010 0000 1001 0000 0010 0000 1000
1AC00F -- 0001 0010 0010 0100 1000 0001 0000 0100 0001 0000 1000 1000
1AD813 -- 0001 0010 0010 0100 1000 0010 0000 0100 0001 0001 0000 1000
1B0A6F -- 0001 0010 0000 1000 0001 0010 0100 0100 0010 0000 1000 1000
1B5F03 -- 0001 0010 0000 1000 1001 0010 0010 0001 0000 0100 0000 1000
1BC8EF -- 0001 0010 0000 1000 1000 0010 0100 0000 1000 0100 1000 1000
1BCA23 -- 0001 0010 0000 1000 1000 0010 0100 0100 0010 0100 0000 1000
1CDB2B -- 0001 0010 0001 0000 1000 0010 0000 1000 0010 0100 0100 1000
```

FIG. 9B

```
1E46FB -- 0001 0010 0010 0000 1001 0000 0010 0000 1000 1000 0100 1000
1E4743 -- 0001 0010 0010 0000 1001 0000 0010 0001 0001 0000 0100 1000
1E475B -- 0001 0010 0010 0000 1001 0000 0010 0001 0001 0010 0000 1000
1E4E03 -- 0001 0010 0010 0000 1001 0000 1000 0100 0001 0000 0100 1000
1E4F03 -- 0001 0010 0010 0000 1001 0000 1000 1000 0001 0000 0100 1000
1E531B -- 0001 0010 0010 0000 1001 0001 0000 0000 0001 0010 0000 1000
1ED31B -- 0001 0010 0010 0000 1000 1001 0000 1000 0001 0010 0000 1000
1ED84F -- 0001 0010 0010 0000 1000 0010 0000 0100 1001 0000 1000 1000
1EF8CB -- 0001 0010 0010 0000 1000 1000 0100 0000 1000 0010 0100 1000
1EFB03 -- 0001 0010 0010 0000 1000 1000 0100 1000 0001 0000 0100 1000
1F4063 -- 0001 0010 0010 0001 0001 0000 0100 0001 0010 0000 0100 1000
1FCC23 -- 0001 0010 0010 0010 0001 0000 1000 0001 0010 0100 0000 1000
220083 -- 0010 0100 0010 0100 0001 0000 0100 0010 0100 0001 0000 1000
220193 -- 0010 0100 0010 0100 0001 0000 0100 0010 0000 1001 0000 1000
220403 -- 0010 0100 0010 0100 0001 0000 1001 0000 0100 0001 0000 1000
22040F -- 0010 0100 0010 0100 0001 0000 1001 0000 0100 0000 1000 1000
220423 -- 0010 0100 0010 0100 0001 0000 1001 0000 0100 0100 0000 1000
220D93 -- 0010 0100 0010 0100 0001 0000 1000 0010 0000 1001 0000 1000
226DBA -- 0010 0100 0010 0100 0010 0000 1000 0010 0000 1000 0100 0100
22D9D3 -- 0010 0100 0010 0100 1000 0010 0000 0010 0001 0001 0000 1000
264403 -- 0010 0100 0010 0000 1001 0000 1001 0000 0100 0001 0000 1000
26440F -- 0010 0100 0010 0000 1001 0000 1001 0000 0100 0000 1000 1000
264423 -- 0010 0100 0010 0000 1001 0000 1001 0000 0100 0100 0000 1000
264F70 -- 0010 0100 0010 0000 1001 0000 1000 1000 0010 0001 0000 0100
264F80 -- 0010 0100 0010 0000 1001 0000 1000 1000 0100 0001 0000 0100
265380 -- 0010 0100 0010 0000 1001 0001 0000 1000 0100 0001 0000 0100
26C9F0 -- 0010 0100 0010 0000 1000 0010 0010 0010 0010 0001 0000 0100
26DD10 -- 0010 0100 0010 0000 1000 0010 0001 0001 0000 1001 0000 0100
26E533 -- 0010 0100 0010 0000 1000 0100 1001 0001 0000 1000 0000 1000
26E880 -- 0010 0100 0010 0000 1000 0100 0100 0010 0100 0001 0000 0100
26FB80 -- 0010 0100 0010 0000 1000 1000 0100 1000 0100 0001 0000 0100
2701BB -- 0010 0100 0010 0001 0000 0100 0001 0010 0000 1000 0100 1000
274CB3 -- 0010 0100 0010 0001 0001 0000 1000 0010 0100 1000 0000 1000
27C070 -- 0010 0100 0010 0010 0001 0000 0100 0001 0010 0001 0000 0100
3024FB -- 0000 1000 0001 0000 0100 0100 1001 0000 1000 1000 0100 1000
30E543 -- 0000 1000 0001 0000 1000 0100 1001 0001 0001 0000 0100 1000
312813 -- 0000 1000 0001 0001 0010 0100 0100 0001 0000 1001 0000 1000
315C43 -- 0000 1000 0001 0001 0001 0010 0001 0000 1001 0000 0100 1000
315CCB -- 0000 1000 0001 0001 0001 0010 0001 0000 1000 0010 0100 1000
317793 -- 0000 1000 0001 0001 0010 0001 0010 0010 0000 1001 0000 1000
317DDB -- 0000 1000 0001 0001 0010 0010 0001 0010 0001 0010 0000 1000
339CAB -- 0000 1000 0000 1000 0100 0010 0001 0010 0100 0100 0100 1000
33A293 -- 0000 1000 0000 1000 0100 0100 0010 0100 0100 1001 0000 1000
33A72B -- 0000 1000 0000 1000 0100 0100 0010 0001 0010 0100 0100 1000
33B9AF -- 0000 1000 0000 1000 0100 1000 0100 0010 0010 0100 1000 1000
344C83 -- 0000 1000 1001 0000 1001 0000 1000 0010 0100 0001 0000 1000
344DBA -- 0000 1000 1001 0000 1001 0000 1000 0010 0000 1000 0100 0100
34E810 -- 0000 1000 1001 0000 1000 0100 0100 0001 0000 1001 0000 0100
35736E -- 0000 1000 1001 0001 0010 0001 0000 1000 0010 0000 1000 0100
3613AF -- 0000 1000 0010 0000 0100 1001 0000 1000 0100 0100 1000 1000
3624AF -- 0000 1000 0010 0000 0100 0100 1001 0000 1001 0000 1000 1000
37178F -- 0000 1000 0010 0001 0000 1001 0010 0010 0000 0100 1000 1000
376E2A -- 0000 1000 0010 0001 0010 0000 1000 0100 0010 0100 0100 0100
3770FE -- 0000 1000 0010 0001 0010 0001 0000 0100 1000 1000 1000 0100
3771AF -- 0000 1000 0010 0001 0010 0001 0000 0010 0010 0100 1000 1000
37844F -- 0000 1000 0010 0010 0000 0100 1001 0000 1001 0000 1000 1000
3784EF -- 0000 1000 0010 0010 0000 0100 1001 0000 1000 0100 1000 1000
3899AF -- 0000 1000 0100 0010 0100 0010 0000 0010 0010 0100 1000 1000
38A91B -- 0000 1000 0100 0010 0100 0100 0100 1001 0000 0010 0000 1000
38B02B -- 0000 1000 0100 0010 0100 1000 0001 0000 0100 0100 0100 1000
38D093 -- 0000 1000 0100 0000 1000 1001 0000 0100 0100 1001 0000 1000
39943B -- 0000 1000 0100 0010 0000 1001 0001 0000 0100 1000 0100 1000
399DEB -- 0000 1000 0100 0010 0000 0010 0001 0010 0010 0010 0100 1000
39A933 -- 0000 1000 0100 0010 0010 0100 0100 1001 0000 1000 0000 1000
39B50E -- 0000 1000 0100 0010 0000 1000 1001 0001 0000 0100 1000 0100
39DE80 -- 0000 1000 0100 0010 0001 0010 0010 0010 0100 0001 0000 0100
```

FIG. 9C

```
39DF90 -- 0000 1000 0100 0010 0001 0010 0010 0010 0000 1001 0000 0100
3AB880 -- 0000 1000 0100 0100 0100 1000 0100 0010 0100 0001 0000 0100
3AE210 -- 0000 1000 0100 0100 1000 0100 0010 0100 0001 0001 0000 0100
3B0A9B -- 0000 1000 0100 1000 0001 0010 0100 0100 0100 0010 0000 1000
3B1143 -- 0000 1000 0100 1000 0001 0001 0000 1001 0001 0000 0100 1000
3B1D5B -- 0000 1000 0100 1000 0001 0010 0001 0001 0001 0010 0000 1000
3B63AF -- 0000 1000 0100 1000 0010 0000 0100 1000 0100 0100 1000 1000
3B83CA -- 0000 1000 0100 1000 0100 0001 0000 1000 1000 0010 0100 0100
3B9AB3 -- 0000 1000 0100 1000 0100 0010 0010 0100 0100 1000 0000 1000
3B9ECA -- 0000 1000 0100 1000 0100 0010 0010 0000 1000 0010 0100 0100
3BBDEE -- 0000 1000 0100 1000 0100 1000 1000 0010 0010 0000 1000 0100
3BDAE3 -- 0000 1000 0100 1000 1000 0010 0010 0100 1000 0100 0000 1000
3C35C3 -- 0000 1000 1000 0001 0000 1000 1001 0010 0001 0000 0100 1000
3C3C8B -- 0000 1000 1000 0001 0000 1000 1000 0010 0100 0010 0100 1000
3C5C43 -- 0000 1000 1000 0001 0001 0010 0001 0000 1001 0000 0100 1000
3C5D93 -- 0000 1000 1000 0001 0001 0010 0001 0010 0000 1001 0000 1000
3C689B -- 0000 1000 1000 0001 0010 0010 0100 0010 0100 0010 0000 1000
3C7DDB -- 0000 1000 1000 0001 0010 0010 0001 0010 0001 0010 0000 1000
3CE53B -- 0000 1000 1000 0000 1000 0100 1001 0001 1000 1000 1000 1000
3DCD10 -- 0000 1000 1000 0010 0001 0000 1000 1001 0000 1001 0000 0100
3E200A -- 0000 1000 1000 0100 0010 0100 0001 0000 0100 0010 0100 0100
3E28CB -- 0000 1000 1000 0100 0010 0100 0100 0000 1000 0010 0100 1000
3E2CEB -- 0000 1000 1000 0100 0010 0100 1000 0000 1000 0100 0100 1000
3EEDC2 -- 0000 1000 1000 0100 1000 0100 1000 0010 0001 0000 0100 0100
3F04CB -- 0000 1000 1000 1000 0001 0000 1001 0000 1000 0010 0100 1000
3F1C43 -- 0000 1000 1000 1000 0001 0010 0001 0000 1001 0000 0100 1000
3F8C8B -- 0000 1000 1000 0100 0000 1000 0010 0100 0010 0100 1000
624EDB -- 0010 0000 0100 0100 1001 0000 1000 0100 1000 0010 0000 1000
664E93 -- 0010 0000 0010 0000 1001 0000 1000 0100 0100 1001 0000 1000
66E4EB -- 0010 0000 0010 0000 1000 0100 1001 0000 1000 0100 0100 1000
66E53B -- 0010 0000 0010 0000 1000 0100 1001 0001 0000 1000 0100 1000
66EF8B -- 0010 0000 0010 0000 1000 0100 1000 1000 0100 0010 0100 1000
674093 -- 0010 0000 0010 0001 0001 0000 0100 0010 0100 1001 0000 1000
674883 -- 0010 0000 0010 0001 0001 0010 0100 0010 0100 0001 0000 1000
674993 -- 0010 0000 0010 0001 0001 0010 0100 0010 0000 1001 0000 1000
676B83 -- 0010 0000 0010 0001 0010 0010 0100 1000 0100 0001 0000 1000
6E00AE -- 0010 0000 1000 0100 0001 0000 0100 0010 0100 0100 1000 0100
6E0510 -- 0010 0000 1000 0100 0001 0000 1001 0001 0000 1001 0000 0100
6E1BBE -- 0010 0000 1000 0100 0001 0010 0000 1000 0100 1000 1000 0100
6E1DBE -- 0010 0000 1000 0100 0001 0010 0001 0010 0000 1000 1000 0100
6E6880 -- 0010 0000 1000 0100 0010 0010 0100 0010 0100 0001 0000 0100
6E68B3 -- 0010 0000 1000 0100 0010 0010 0100 0010 0100 1000 0000 1000
6E6990 -- 0010 0000 1000 0100 0010 0010 0100 0010 0000 1001 0000 0100
6EE880 -- 0010 0000 1000 0100 1000 0100 0100 0010 0100 0001 0000 0100
6EEF80 -- 0010 0000 1000 0100 1000 0100 1000 1000 0100 0001 0000 0100
70235B -- 0010 0001 0000 0100 0010 0100 0000 1000 1001 0010 0000 1000
70266B -- 0010 0001 0000 0100 0010 0100 0010 0000 0010 0010 0100 1000
703413 -- 0010 0001 0000 0100 0000 1000 1001 0000 0100 1001 0000 1000
703593 -- 0010 0001 0000 0100 0000 1000 1001 0010 0000 1001 0000 1000
7079CB -- 0010 0001 0000 0100 0010 0010 0000 0010 0001 0010 0100 1000
70CEBB -- 0010 0001 0000 0100 1000 0000 1000 0100 0100 1000 0100 1000
70EE02 -- 0010 0001 0000 0100 1000 0100 1000 0100 0001 0000 0100 0100
70EE03 -- 0010 0001 0000 0100 1000 0100 1000 0100 0001 0000 0100 1000
70EE10 -- 0010 0001 0000 0100 1000 0100 1000 0100 0001 0001 0000 0100
70EE80 -- 0010 0001 0000 0100 1000 0100 1000 0100 0001 0001 0000 0100
71DC8F -- 0010 0001 0000 0010 0001 0010 0001 0010 0100 0000 1000 1000
71E40B -- 0010 0001 0000 0010 0010 0000 1001 0000 0100 0010 0100 1000
72E0F3 -- 0010 0001 0010 0100 1000 0100 0001 0000 1000 1000 0000 1000
733CBB -- 0010 0001 0000 1000 0000 1000 1000 0010 0100 1000 0100 1000
76209B -- 0010 0001 0010 0000 0100 0100 0001 0010 0100 0010 0000 1000
76241B -- 0010 0001 0010 0000 0100 0100 1001 0000 0100 0010 0000 1000
7624DB -- 0010 0001 0010 0000 0100 0100 1001 0000 1000 0010 0000 1000
762C9B -- 0010 0001 0010 0000 0100 0100 1000 0010 0100 0010 0000 1000
7665CF -- 0010 0001 0010 0000 0010 0000 1001 0010 0001 0000 1000 1000
76DC3B -- 0010 0001 0010 0000 1000 0010 0001 0000 0100 1000 0100 1000
76E03B -- 0010 0001 0010 0000 1000 0100 0001 0000 0100 1000 0100 1000
```

FIG. 9D

```
76E08F -- 0010 0001 0010 0000 1000 0100 0001 0010 0100 0000 1000 1000
76E40F -- 0010 0001 0010 0000 1000 0100 1001 0000 0100 0000 1000 1000
76E423 -- 0010 0001 0010 0000 1000 0100 1001 0000 0100 0100 0000 1000
76E51B -- 0010 0001 0010 0000 1000 0100 1001 0001 0000 0010 0000 1000
770042 -- 0010 0001 0010 0001 0000 0100 0001 0000 1001 0000 0100 0100
77018F -- 0010 0001 0010 0001 0000 0100 0001 0010 0000 0100 1000 1000
77035B -- 0010 0001 0010 0001 0000 0100 0000 1000 1001 0010 0000 1000
770D8F -- 0010 0001 0010 0001 0000 0100 1000 0010 0000 0100 1000 1000
770DE3 -- 0010 0001 0010 0001 0000 0100 1000 0010 0010 0000 0100 1000
772313 -- 0010 0001 0010 0001 0010 0100 0000 1000 0001 0001 0000 1000
77359B -- 0010 0001 0010 0001 0000 1000 1001 0010 0000 0010 0000 1000
7762DB -- 0010 0001 0010 0001 0010 0000 0100 0100 1000 0010 0000 1000
776D8F -- 0010 0001 0010 0001 0010 0000 1000 0010 0000 0100 1000 1000
776DA3 -- 0010 0001 0010 0001 0010 0000 1000 0010 0010 0100 0000 1000
776E02 -- 0010 0001 0010 0001 0010 0000 1000 0100 0001 0000 0100 0100
776E10 -- 0010 0001 0010 0001 0010 0000 1000 0100 0001 0001 0000 0100
81140F -- 0100 0001 0000 1001 0000 1001 0001 0000 0100 0000 1000 1000
811423 -- 0100 0001 0000 1001 0000 1001 0001 0000 0100 0100 0000 1000
81146F -- 0100 0001 0000 1001 0000 1001 0001 0000 0010 0000 1000 1000
81317B -- 0100 0001 0000 1001 0000 1000 0001 0001 0010 0010 0000 1000
813D1B -- 0100 0001 0000 1001 0000 1000 1000 1001 0000 0010 0000 1000
81EFBB -- 0100 0001 0000 0010 0010 0000 1000 1000 0100 1000 0100 1000
83863F -- 0100 0001 0000 1000 0100 0001 0010 0000 0100 1000 1000 1000
83B02F -- 0100 0001 0000 1000 0100 1000 0001 0000 0100 0100 1000 1000
83B03F -- 0100 0001 0000 1000 0100 1000 0001 0000 0100 1000 1000 1000
83B10F -- 0100 0001 0000 1000 0100 1000 0001 0001 0000 0100 1000 1000
83B17B -- 0100 0001 0000 1000 0100 1000 0001 0001 0010 0010 0000 1000
83B62B -- 0100 0001 0000 1000 0100 1000 0010 0000 0100 0100 0100 1000
83B62F -- 0100 0001 0000 1000 0100 1000 0010 0000 0100 0100 1000 1000
83BC0F -- 0100 0001 0000 1000 0100 1000 1000 0001 0000 0100 1000 1000
83BD1B -- 0100 0001 0000 1000 0100 1000 1000 1001 0000 0010 0000 1000
83BD8F -- 0100 0001 0000 1000 0100 1000 1000 0010 0000 0100 1000 1000
83BF03 -- 0100 0001 0000 1000 0100 1000 1000 1000 0001 0000 0100 1000
846EEF -- 0100 0001 0001 0000 0010 0000 1000 0100 1000 0100 1000 1000
850EC3 -- 0100 0001 0001 0001 0000 0100 1000 0100 1000 0001 0000 1000
8561C3 -- 0100 0001 0001 0001 0010 0000 0100 0010 0001 0000 0100 1000
8561DB -- 0100 0001 0001 0001 0010 0000 0100 0010 0001 0010 0000 1000
856EC3 -- 0100 0001 0001 0001 0010 0000 1000 0100 1000 0001 0000 1000
857023 -- 0100 0001 0001 0001 0010 0001 0000 0100 0010 0100 0000 1000
858F83 -- 0100 0001 0001 0010 0000 0100 1000 1000 0100 0001 0000 1000
88DA0F -- 0100 0010 0100 0000 1000 0010 0010 0100 0001 0000 1000 1000
88DA7B -- 0100 0010 0100 0000 1000 0010 0010 0100 0010 0010 0000 1000
88F653 -- 0100 0010 0100 0000 1000 1000 0010 0000 1001 0001 0000 1000
88F6D3 -- 0100 0010 0100 0000 1000 1000 0010 0000 1000 1001 0000 1000
88F6FB -- 0100 0010 0100 0000 1000 1000 0010 0000 1000 1000 0100 1000
898843 -- 0100 0010 0100 0010 0000 0100 0100 0001 0001 0000 0100 1000
898B7B -- 0100 0010 0100 0010 0000 0100 0100 1000 0010 0010 0000 1000
8A103B -- 0100 0010 0100 0100 0001 0001 0000 0100 0000 1000 0100 1000
8A1303 -- 0100 0010 0100 0100 0001 0001 0000 1000 0001 0000 0100 1000
8A161B -- 0100 0010 0100 0100 0001 0001 0010 0000 0100 0010 0000 1000
8ADEC3 -- 0100 0010 0100 0100 1000 0010 0010 0000 1000 0001 0000 1000
8C3E2F -- 0100 0000 1000 0001 0000 1000 1000 0100 0010 0100 1000 1000
8C5DD3 -- 0100 0000 1000 0001 0001 0010 0001 0010 0001 0001 0000 1000
8C77F3 -- 0100 0000 1000 0001 0010 0001 0010 0010 0010 0001 0000 1000
8D136F -- 0100 0000 1000 1001 0000 1001 0000 1000 0010 0000 1000 1000
8D137B -- 0100 0000 1000 1001 0000 1001 0000 1000 0010 0010 0000 1000
8D41DB -- 0100 0000 1000 1001 0001 0000 0100 0010 0001 0010 0000 1000
8D4EDB -- 0100 0000 1000 1001 1000 1001 1000 0100 1000 0010 0000 1000
8D71D3 -- 0100 0000 1000 1001 0010 0001 0000 0010 0001 0001 0000 1000
8DA993 -- 0100 0000 1000 0010 0010 0100 0100 0010 0000 1001 0000 1000
8DE453 -- 0100 0000 1000 0010 0010 0000 1001 0000 1001 0001 0000 1000
8E202B -- 0100 0000 1000 0100 0010 0100 0001 0000 0100 0100 0100 1000
8E2A1B -- 0100 0000 1000 0100 0010 0100 0100 0100 0001 0010 0000 1000
8E642B -- 0100 0000 1000 0100 0010 0000 1001 0000 0100 0100 0100 1000
8E655B -- 0100 0000 1000 0100 0010 0000 1001 0001 0001 0010 0000 1000
8E6F43 -- 0100 0000 1000 0100 0010 0000 1000 1000 1001 0000 0100 1000
```

FIG. 9E

```
8EADBB -- 0100 0000 1000 0100 0100 0100 1000 0010 0000 1000 0100 1000
8F4E03 -- 0100 0000 1000 1000 1001 0000 1000 0100 0001 0000 0100 1000
8F4E1B -- 0100 0000 1000 1000 1001 0000 1000 0100 0001 0010 0000 1000
8F4EC3 -- 0100 0000 1000 1000 1001 0000 1000 0100 1000 0001 0000 1000
8F4EDB -- 0100 0000 1000 1000 1001 0000 1000 0100 1000 0010 0000 1000
8FE2E3 -- 0100 0000 1000 1000 1000 0100 0010 0100 1000 0100 0000 1000
98723F -- 0100 0010 0000 0100 0010 0001 0010 0100 0000 1000 1000 1000
988683 -- 0100 0010 0000 0100 0100 0001 0010 0010 0100 0001 0000 1000
99511B -- 0100 0010 0000 1001 0001 0001 0000 1001 0000 0010 0000 1000
99C253 -- 0100 0010 0000 0010 0001 0000 0100 0100 1001 0001 0000 1000
99DA83 -- 0100 0010 0000 0010 0001 0010 0010 0100 0100 0001 0000 1000
99DA9B -- 0100 0010 0000 0010 0001 0010 0010 0100 0100 0010 0000 1000
99F0D3 -- 0100 0010 0000 0010 0010 0001 0000 0100 1000 1001 0000 1000
99F32B -- 0100 0010 0000 0010 0010 0001 0000 1000 0010 0100 0100 1000
9A8193 -- 0100 0010 0010 0100 0100 0001 0000 0010 0000 1001 0000 1000
9B02EF -- 0100 0010 0000 1000 0001 0000 0100 0100 1000 0100 1000 1000
9B034F -- 0100 0010 0000 1000 0001 0000 0100 1000 1001 0000 1000 1000
9B1143 -- 0100 0010 0000 1000 0001 0001 0000 1001 0001 0000 0100 1000
9B115B -- 0100 0010 0000 1000 0001 0001 0000 1001 0001 0010 0000 1000
9B1A13 -- 0100 0010 0000 1000 0001 0010 0010 0100 0001 0001 0000 1000
9B1A7B -- 0100 0010 0000 1000 0001 0010 0010 0100 0010 0010 0000 1000
9B50C3 -- 0100 0010 0000 1000 1001 0001 0000 0100 1000 0001 0000 1000
9B531B -- 0100 0010 0000 1000 1001 0001 0000 1000 0001 0010 0000 1000
9B7F63 -- 0100 0010 0000 1000 0010 0010 0010 0001 0010 0000 0100 1000
9B94F3 -- 0100 0010 0000 1000 0100 1001 0001 0000 1000 1000 0000 1000
9B99AF -- 0100 0010 0000 1000 0100 0010 0000 0010 0010 0100 1000 1000
9B9AF3 -- 0100 0010 0000 1000 0100 0010 0010 0100 1000 1000 0000 1000
9B9E6B -- 0100 0010 0000 1000 0100 0010 0010 0000 0010 0010 0100 1000
9BC143 -- 0100 0010 0000 1000 1000 0001 0000 1001 0001 0000 0100 1000
9BD03B -- 0100 0010 0000 1000 1000 1001 0000 0100 0000 1000 0100 1000
9BD0C3 -- 0100 0010 0000 1000 1000 1001 0000 0100 1000 0001 0000 1000
9BD303 -- 0100 0010 0000 1000 1000 1001 0000 1000 0001 0000 0100 1000
9BFB03 -- 0100 0010 0000 1000 1000 1000 0100 1000 0001 0000 0100 1000
9BFB1B -- 0100 0010 0000 1000 1000 1000 0100 1000 0001 0010 0000 1000
9C19AF -- 0100 0010 0001 0000 0100 0010 0000 0010 0010 0100 1000 1000
9C2D33 -- 0100 0010 0001 0000 0100 0100 1000 1001 0000 1000 0000 1000
9C2F3B -- 0100 0010 0001 0000 0100 0100 1000 1000 0000 1000 0100 1000
9C310F -- 0100 0010 0001 0000 0100 1000 0001 0001 0000 0100 1000 1000
9C3F23 -- 0100 0010 0001 0000 0100 1000 1000 1000 0010 0100 0000 1000
9C3F63 -- 0100 0010 0001 0000 0100 1000 1000 1000 0010 0000 0100 1000
9C579B -- 0100 0010 0001 0000 1001 0001 0010 0010 0000 0010 0000 1000
9C6A1B -- 0100 0010 0001 0000 0010 0010 0100 0100 0001 0010 0000 1000
9C7AC3 -- 0100 0010 0001 0000 0010 0010 0010 0100 1000 0001 0000 1000
9CCCAB -- 0100 0010 0001 0000 1000 0000 1000 0010 0100 0100 0100 1000
9CCF43 -- 0100 0010 0001 0000 1000 0000 1000 1000 1001 0000 0100 1000
9CCF5B -- 0100 0010 0001 0000 1000 0000 1000 1000 1001 0010 0000 1000
9CD433 -- 0100 0010 0001 0000 1000 1001 0001 0000 0100 1000 0000 1000
9CD59B -- 0100 0010 0001 0000 1000 1001 0001 0010 0000 0010 0000 1000
9CD5B3 -- 0100 0010 0001 0000 1000 1001 0001 0010 0000 1000 0000 1000
9D182F -- 0100 0010 0001 0001 0000 0010 0000 0100 0010 0100 1000 1000
9D18EF -- 0100 0010 0001 0001 0000 0010 0000 0100 1000 0100 1000 1000
9D1AC3 -- 0100 0010 0001 0001 0000 0010 0010 0100 1000 0001 0000 1000
9D5803 -- 0100 0010 0001 0001 0001 0010 0000 0100 0001 0000 0100 1000
9D58DB -- 0100 0010 0001 0001 0001 0010 0000 0100 1000 0010 0000 1000
9D58E3 -- 0100 0010 0001 0001 0001 0010 0000 0100 1000 0100 0000 1000
9D638F -- 0100 0010 0001 0001 0010 0000 0100 1000 0100 0000 1000 1000
9D699B -- 0100 0010 0001 0001 0010 0010 0100 0010 0000 0010 0000 1000
9D8BDB -- 0100 0010 0001 0010 0000 0100 0100 1000 1000 0010 0000 1000
9D8F13 -- 0100 0010 0001 0010 0000 0100 1000 1000 0001 0001 0000 1000
9D8FC3 -- 0100 0010 0001 0010 0000 0100 1000 1000 1000 0001 0000 1000
9D9F0F -- 0100 0010 0001 0010 0000 0010 0010 0001 0000 0100 1000 1000
9DD18F -- 0100 0010 0001 0010 0001 0001 0000 0010 0000 0100 1000 1000
9DD1A3 -- 0100 0010 0001 0010 0001 0001 0000 0010 0010 0100 0000 1000
9DE30F -- 0100 0010 0001 0010 0010 0000 0100 1000 0001 0000 1000 1000
9DE3DB -- 0100 0010 0001 0010 0010 0000 0100 1000 1000 0010 0000 1000
9DF8C3 -- 0100 0010 0001 0010 0010 0010 0000 0100 1000 0001 0000 1000
```

FIG. 9F

```
9E069B -- 0100 0010 0010 0000 0100 0001 0010 0010 0100 0010 0000 1000
9E0E2F -- 0100 0010 0010 0000 0100 0000 1000 0100 0010 0100 1000 1000
9E6E2F -- 0100 0010 0010 0000 0010 0000 1000 0100 0010 0100 1000 1000
9E8C73 -- 0100 0010 0010 0010 0100 0000 1000 0001 0010 0001 0000 1000
9E8DBB -- 0100 0010 0010 0010 0100 0000 1000 0010 0000 1000 0100 1000
9EB073 -- 0100 0010 0010 0010 0100 1000 0001 0000 0010 0001 0000 1000
9F179B -- 0100 0010 0010 0001 0000 1001 0010 0010 0000 0010 0000 1000
9F17B3 -- 0100 0010 0010 0001 0000 1001 0010 0010 0000 1000 0000 1000
9F8723 -- 0100 0010 0010 0010 0000 0100 0010 0001 0010 0100 0000 1000
9F91BB -- 0100 0010 0010 0010 0000 1001 0000 0010 0000 1000 0100 1000
9FB763 -- 0100 0010 0010 0010 0000 1000 0010 0001 0010 0000 0100 1000
9FC463 -- 0100 0010 0010 0010 0001 0000 1001 0000 0010 0000 0100 1000
A2207B -- 0100 0100 0010 0100 0010 0100 0001 0000 0010 0010 0000 1000
A2647B -- 0100 0100 0010 0100 0010 0000 1001 0000 0010 0010 0000 1000
A30E4F -- 0100 0100 0000 1000 0001 0000 1000 0100 1001 0000 1000 1000
A30F93 -- 0100 0100 0000 1000 0001 0000 1000 1000 0100 1001 0000 1000
A31DD3 -- 0100 0100 0000 1000 0001 0010 0001 0010 0001 0001 0000 1000
A3226F -- 0100 0100 0000 1000 0010 0100 0010 0100 0010 0000 1000 1000
A34EDB -- 0100 0100 0000 1000 1001 0000 1000 0100 1000 0010 0000 1000
A37BBB -- 0100 0100 0000 1000 0010 0010 0000 1000 0100 1000 0100 1000
A3888F -- 0100 0100 0000 1000 0100 0010 0100 0010 0100 0000 1000 1000
A3DC43 -- 0100 0100 0000 1000 1000 0010 0001 0000 1001 0000 0100 1000
A3E223 -- 0100 0100 0000 1000 1000 0100 0010 0100 0010 0100 0000 1000
A3EEDB -- 0100 0100 0000 1000 1000 0100 1000 0100 1000 0010 0000 1000
A726CF -- 0100 0100 0010 0001 0010 0100 0010 0000 1000 0000 1000 1000
A726F3 -- 0100 0100 0010 0001 0010 0100 0010 0000 1000 1000 0000 1000
A72783 -- 0100 0100 0010 0001 0010 0100 0010 0010 0000 0100 0000 1000
A727B3 -- 0100 0100 0010 0001 0010 0100 0010 0010 0000 1000 0000 1000
A762DB -- 0100 0100 0010 0001 0010 0000 0100 0100 1000 0010 0000 1000
A766EB -- 0100 0100 0010 0001 0010 0000 0010 0000 1000 0100 0100 1000
A76CEF -- 0100 0100 0010 0001 0010 0000 1000 0000 1000 0100 1000 1000
A76D8F -- 0100 0100 0010 0001 0010 0000 1000 0010 0000 0100 1000 1000
A76ECF -- 0100 0100 0010 0001 0010 0000 1000 0100 1000 0000 1000 1000
A87603 -- 0100 0100 0100 0001 0010 0001 0010 0000 0100 0001 0000 1000
A8761B -- 0100 0100 0100 0001 0010 0001 0010 0000 0100 0010 0000 1000
A8DC43 -- 0100 0100 0100 0000 1000 0010 0001 0000 1001 0000 0100 1000
AB39DB -- 0100 0100 0100 1000 0000 1000 0100 0010 0001 0010 0000 1000
AC4403 -- 0100 0100 1000 0001 0001 0000 1001 0000 0100 0001 0000 1000
AC4D93 -- 0100 0100 1000 0001 0001 0000 1000 0010 0000 1001 0000 1000
AE0423 -- 0100 0100 1000 0100 0001 0000 1001 0000 0100 0100 0000 1000
AE79BB -- 0100 0100 1000 0100 0010 0010 0000 0010 0000 1000 0100 1000
B37A73 -- 0100 1000 0000 1000 0010 0010 0010 0100 0010 0001 0000 1000
B3BDF3 -- 0100 1000 0000 1000 0100 1000 1000 0010 0010 0001 0000 1000
B88FE3 -- 0100 1000 0100 0010 0100 0000 1000 1000 1000 0100 0000 1000
B8A313 -- 0100 1000 0100 0010 0100 0100 0000 1000 0001 0001 0000 1000
B9B533 -- 0100 1000 0100 0010 0000 1000 1001 0001 0000 1000 0000 1000
BC13A3 -- 0100 1000 1000 0001 0000 1001 0000 1000 0100 0100 0000 1000
BC4EE3 -- 0100 1000 1000 0001 0001 0000 1000 0100 1000 0100 0000 1000
BC7313 -- 0100 1000 1000 0001 0010 0001 0000 1000 0001 0001 0000 1000
BD3733 -- 0100 1000 1000 1001 0000 1000 0010 0001 0000 1000 0000 1000
BD399B -- 0100 1000 1000 1001 0000 1000 0100 0010 0000 0010 0000 1000
BF39C3 -- 0100 1000 1000 1000 0000 1000 0100 0010 0001 0000 0100 1000
BF733B -- 0100 1000 1000 1000 0010 0001 0000 1000 0000 1000 0100 1000
BF7673 -- 0100 1000 1000 1000 0010 0001 0000 1000 1000 0100 1000 1000
BF9D9B -- 0100 1000 1000 1000 0100 0010 0001 0010 0000 0010 0000 1000
```

VFO  "1 0 0 1 0 0 1 0 0 1 0 0"

SYNCHRONOUS PATTERN  "1 0 0 1 0 0 0 1 0 0 0 1 0 0 1 0 1 0 1 0 1 0 1 0 0 0 0 1 0 0 1 0 1 0 0 1"

VFO　"1 0 0 1 0 0 1 0 0 1 0 0"

SYNCHRONOUS PATTERN　"1 0 0 1 0 1 0 0 1 0 1 0 0 1 0 1 0 0 0 1 0 1 0 1 0 1 0 0 1 0 0 0 1 0 0 1"

VFO　"1 0 0 1 0 0 1 0 0 1 0 0"

SYNCHRONOUS PATTERN　"1 0 0 1 0 1 0 0 1 0 1 0 0 1 0 1 0 1 0 1 0 1 0 0 0 1 0 0 1 0 0 0 1 0 0 1"

VFO  "1 0 0 1 0 0 1 0 0 1 0 0"

SYNCHRONOUS PATTERN  "0 1 0 1 0 1 0 1 0 1 0 0 1 0 0 0 1 0 0 1 0 1 0 0 1 0 1 0 0 1 0 0 1 0 0 1"

VFO  "0 1 0 0 1 0 0 1 0 0 1 0"

SYNCHRONOUS PATTERN  "0 1 0 0 1 0 1 0 0 1 0 1 0 0 1 0 1 0 1 0 1 0 1 0 0 0 1 0 0 1 0 0 0 1 0 0"

VFO  "0 1 0 0 1 0 0 1 0 0 1 0"

SYNCHRONOUS PATTERN  "0 1 0 0 1 0 1 0 0 1 0 1 0 0 1 0 1 0 1 0 1 0 0 0 1 0 0 0 1 0 0 1 0 0 0 1"

METHOD OF DETERMINING A SYSCHRONOUS SIGNAL PATTERN AND METHOD OF AND DEVICE FOR RECORDING THE SYNCHRONOUS SIGNAL PATTERN ON A MEDIUM

This application is a continuation of application Ser. No. 07/886,935 filed May 22, 1992, now abandoned.

BACKGROUND OF THE INVENTION

1. Field of the Invention

The present invention relates a method of determining a synchronous signal pattern in a format of information to be recorded on a medium in an information recording apparatus such as, e.g., an optical disk memory or the like and a method of and device for recording the synchronous signal pattern determined by the former method on the medium.

2. Related Background Art

FIG. 1 shows one example of an ISO-standardized sector format of a WORM type or rewritable type optical disk of a 5.25 in. continuous servo tracking system. Table 1 shows patterns and meanings of the symbols with which the respective portions of FIG. 1 are marked.

TABLE 1

| Symbols | Meanings | Patterns |
|---|---|---|
| SM | Sector mark | 5-byte length. Pattern is "$1^{10}0^6 1^6 0^{14} 1^6 0^6 1^6 0^6 1^{10} 0^2 1^1 0^2 1^1 0^2 1^1 0^1$" ($1^a, 0^b$ are code bits and indicate that "1" continues by the number a, while "0" continues by the number b. This corresponds to code bits of Y sequence in modulation. |
| VF0123 | Continuous data pattern for PLL lock | VF01-010010010010 . . . 0010 (12 bytes)<br>VF02-100100100100 . . . 0010 (8 bytes)<br>000100100100 . . . 0010 (8 bytes)<br>VF03–VF01<br>VF02 indicates that any one of two patterns is selected by preceding CRC data pattern. |
| AM | Address mark | Pattern has 16 code bits and is "0100100000000100". |
| SYNC | Synchronous signal of data portion | 3-byte length. Pattern is "0100 0010 0100 0010 0010 0010 0100 0100 1000 0010 0100 1000". |
| ID | Address | 2 bytes are recorded as a track number by (2, 7) modulation, and 1 byte is recorded as a sector number by (2, 7) modulation. |
| CRC | ID portion error detection code | 2-byte CRC is recorded by (2, 7) modulation, and generating polynomial is $G(x) = x^{16} - x^{12} - x^5 - 1$ |
| PA | Postamble | ID and CRC are recorded by variable-length words as in (2, 7) modulation. PA is therefore used when not settled by 2 bytes of CRC after modulation. |
| ODF (Offset Detection Flag) | Offset detection mark in tracking error detection using push-pull method | Consisting of specular surface with no groove and no preformat data |
| Gap | Gap | No data in interval of 3-byte length |
| FLAG | Flag indicating that writing has been executed | Pattern to be set continues "100" for 5 bytes |
| ALPC (Auto Laser Power Control) | Test portion for controlling power level of laser | 2-byte length is blank |
| DATA | Area for writing user data | Consisting of 1024-byte user data, 233-byte CRC, ECC and Resync and 12-byte control information |
| BUFFER | Disk rotational fluctuation margin area | No written data |
| RESYNC | Intra DATA area sync special code | 16 code bits<br>0010 0000 0010 0100 |

Referring to Table 1, the VFO pattern is a signal pattern for synchronizing a voltage frequency oscillator (VFO) in a phase locked loop (PLL) circuit of an information recording/reproducing device. Further, in the example given above, the synchronous signal (SYNC) pattern of a data portion has a 3-byte length and is expressed by 48 code bits such as "0100 0010 0100 0010 0010 0010 0100 0100 1000 0010 0100 1000".

This ISO standard synchronous signal pattern is configured to have the following two major characteristics.

(1): The pattern has a sharp auto-correlation.

(2): The pattern can be generated by (2, 7) modulation, and the modulation is completed by 3 bytes without excess and deficiency.

If the condition (1) is not satisfied, there increases a probability to cause a wrong synchronization due to a bit error. When the wrong synchronization takes place, the sector thereof cannot absolutely be reproduced.

Whereas if the condition (2) is satisfied, the generation of the synchronous signal pattern is facilitated during the recording process, and a small-scale circuit may suffice. Further, in the example given above, the (2, 7) modulation is used in the data portion. Hence, the record of the synchronous signal by the same (2, 7) modulation implies that no special consideration is paid to a recording/reproducing signal property on the medium and a property of the detection system.

In contrast with this, we have found out that the correlation property with the VFO pattern has a major role when determining a superiority and inferiority of the synchronous signal pattern from a sharpness of the auto-correlation property. In other words, the conventional method of determining the superiority and inferiority of the pattern from the sharpness of the auto-correlation property does not give any consideration to the correlation property with the VFO pattern. Namely, in the prior art, the optimum pattern is determined by considering the sole synchronous signal pattern.

Therefore, in accordance with the conventional determining method, if no signal exists in front and in rear of a certain synchronous signal pattern, an output of a matching filter exhibits the sharpest peak in some cases. Based on the conventional method, such a synchronous signal pattern is to be optimal. Supposing that a given VFO pattern is disposed in front of the thus determined synchronous signal pattern, however, the output of the matching filter does not necessarily indicate that the synchronous signal pattern has the sharpest peak among all the patterns depending on a combination of the VFO pattern and the synchronous signal pattern in some cases. The above-described ISO pattern is an example thereof.

Besides, we point out the following defects inherent in the prior art.

That is, in the case of considering a conventional ordinary synchronous signal pattern detector, it has a predetermined threshold level with respect to the output value of the matching filter. The synchronous signal pattern is detected at the first timing when the output value exceeds the threshold level. This is a typical method.

FIG. 2 shows an example of a typical synchronous signal pattern detector. Referring to FIG. 2, signals read from a recording medium are sequentially inputted to a shift register 13. On the other hand, a predetermined correct synchronous pattern is stored in a memory 14. The signal inputted to the shift register 13 is compared bitwise or blockwise with the synchronous pattern stored in the memory 14. Outputted then from a coincidence number adding circuit 15 is a correlation value of the thus compared two patterns, i.e., the bit number in which the values coincide with each other. This correlation value is compared with a predetermined threshold value in a threshold comparison circuit 16. A pulse signal indicating that the synchronous pattern has been detected is outputted from a pulse output circuit 17 at a timing when the correlation value exceeds the threshold value. Upon outputting this pulse signal, a reproducing means reproduces the data recorded on the medium subsequently to the detected synchronous pattern.

Herein, if a plurality of synchronous signal pattern detection pulses are mistakenly outputted within one sector, the data number becomes incorrect, resulting in trouble in terms of the system. Hence, the pulse is generally outputted only in the first one detected position within the sector.

According to this method, after the synchronous signal pattern has been once detected, there is no influence, whether the sharp portion of the correlation exists afterward or not. Namely, the correlation property may not be considered after the correct position.

SUMMARY OF THE INVENTION

From the observations given above, we have reached the following conclusions.

(1): A true importance of the synchronous signal pattern of the recording and/or reproducing device lies in not an auto-correlation function but a sharpness of the correlation property between the recording pattern including the VFO pattern and the matching filter. It is therefore possible to surely obtain a more optimal synchronous signal pattern than in the prior art.

(2): When looking at the sharpness of the correlation property, there is no necessity for considering the sharpness behind (right side) the correct position. The time required for obtaining the optimum synchronous signal pattern is thereby reduced.

Accordingly, it is a primary object of the present invention, which obviates the problems inherent in the prior art described above, to provide a method capable of surely determining an optimum synchronous signal pattern.

Further, it is another object of the present invention to provide an information transmitting or recording method, an information recording/reproducing device and an information transmitting device which are arranged to minimize the possibility to detect an incorrect synchronous signal pattern by use of an optimum synchronous signal pattern.

Besides, it is still another object of the present invention to provide an information recording medium arranged to minimize the possibility to detect the incorrect synchronous signal pattern.

To accomplish the foregoing objects, there is provided a method of determining an optimum synchronous signal pattern among samples of a plurality of synchronous patterns different from a predetermined VFO pattern in information configured by sequencing the VFO pattern, the synchronous signal pattern for identifying the head of information and the data, the method comprising the steps of: inputting the respective samples of the VFO pattern and synchronous signal pattern to a matching filter so as to detect correlation properties of the VFO pattern and the synchronous signal pattern with the matching filter; and determining the sample exhibiting an excellent correlation property as the synchronous signal pattern among the samples.

In accordance with one embodiment of the present invention, there is provided a method of determining an optimum synchronous signal pattern among samples of a plurality of synchronous patterns different from a predetermined VFO pattern, in information configured by sequencing the VFO pattern, the synchronous signal pattern for identifying the head of information and the data, the method comprising the steps of: inputting the samples of the VFO pattern and the synchronous signal pattern to a matching filter; obtaining a difference between a maximum output value of the matching filter and the second highest value before outputting the maximum value with respect to each of the samples; comparing the output value differences obtained corresponding to the samples; and determining the sample having a maximum difference between the output values as the synchronous signal pattern.

In accordance with another embodiment of the present invention, there is provided a method of determining an optimum synchronous signal pattern among samples of a plurality of synchronous patterns different from a predetermined VFO pattern, in information configured by sequencing the VFO pattern, the synchronous signal pattern for identifying the head of information and the data, the method comprising steps of: (a) inputting the VFO pattern to a matching filter; (b) inputting one of the samples of the plurality of synchronous signal patterns to the matching filter; (c) obtaining correlation properties of the samples of the inputted VFO pattern and the synchronous signal pattern with the matching filter; (d) obtaining a difference value between a maximum value of the correlation properties obtained in the step (c) and the second highest value preexisting a maximum value exhibiting point; (e) storing the difference value obtained in the step (d) in a first memory; (f) storing the sample of the synchronous signal pattern inputted in the step (b) in a second memory; (g) inputting to the matching filter the sample of the synchronous signal pattern different from the sample previously inputted; (h) obtaining correlation properties of the sample of the synchronous signal pattern inputted in the step (g) and the VFO pattern with the matching filter; (i) obtaining a difference value between a maximum value of the correlation properties obtained in the step (h) and the second highest value preexisting the maximum value exhibiting point; (j) comparing the difference value obtained in the step (i) and the difference value stored in the memory; (k) replacing the difference value stored in the memory with the difference value obtained in the step (i) if the difference value obtained in the step (i) is larger than the difference value stored in the memory as a result of the comparison, clearing the sample of the synchronous signal pattern previously stored in the second memory and storing the sample of the synchronous signal pattern inputted in the step (g) in the second memory; (l) additionally storing the sample of the synchronous signal pattern inputted in the step (g) in the second memory without clearing the sample of the synchronous signal pattern previously stored in the second memory if the difference value obtained in the step (i) is equal to the difference value stored in the memory as a result of the comparison; (m) repeating the steps (g)–(l) until all the samples are inputted to the matching filter; and (n) determining the sample stored in the second memory as the synchronous signal pattern.

In accordance with the first embodiment of the present invention, there is provided an information recording method comprising steps of: forming information by sequencing a VFO pattern, a synchronous signal pattern for identifying the head of information and (2, 7)-modulated data; and recording the formed information on a recording medium, wherein the VFO pattern consists of a repetitive pattern of "1000", and the synchronous signal pattern is a binary signal pattern obtained by (2, 7)-modulating any one of hexadecimal notation representation signals "45A9F3"$_H$, "BE57F3"$_H$, "D4BA73"$_H$, "E527CF"$_H$ and "F949F3"$_H$.

In accordance with the second embodiment of the present invention, there is provided an information recording method comprising steps of: forming information by sequencing a VFO pattern a synchronous signal pattern for identifying the head of information and (1, 7)-modulated data; and recording the formed information on a recording medium, wherein the VFO pattern consists of a repetitive pattern of "100", and the synchronous signal pattern is any one of the following patterns:
"1001000100010010101010100001001001001",
"1001010010100101000101010010010001001",
"1001010010100101010100010010001001" and
"0101010101001000100101001001001001001".

In accordance with the third embodiment of the present invention, there is provided an information recording method comprising steps of: forming information by sequencing a VFO pattern, a synchronous signal pattern for identifying the head of information and (1, 7)-modulated data; and recording the formed information on a recording medium, wherein the VFO pattern consists of a repetitive pattern of "010", and the synchronous signal pattern is any one of the following patterns:
"01001010010100101010100010010001000100" and
"01001010010100101010100010010010001".

In accordance with the first embodiment of the present invention, there is provided an information recording/reproducing apparatus comprising: means for recording, on a recording medium, information configured by sequencing a VFO pattern, a synchronous signal pattern for identifying the head of information and (2, 7)-modulated data; and means for reproducing the information recorded on the recording medium, wherein the VFO pattern consists of a repetitive pattern of "1000", and the synchronous signal pattern is a binary signal pattern obtained by (2, 7)-modulating any one of hexadecimal notation representation signals "45A9F3"$_H$, "BE57F3"$_H$, "D4BA73"$_H$, "E527F"$_H$ and "F949F3"$_H$.

In accordance with the second embodiment of the present invention, there is provided an information recording/reproducing apparatus comprising: means for recording, on a recording medium, information configured by sequencing a VFO pattern, a synchronous signal pattern for identifying the head of information and (1, 7)-modulated data; and means for reproducing the information recorded on the recording medium, wherein the VFO pattern consists of a repetitive pattern of "100", and the synchronous signal pattern is any one of the following patterns
"1001000100010010101010100001001001001",
"1001010010100101000101010010010001001",
"1001010010100101010100010010001001" and
"0101010101001000100101001001001001001".

In accordance with the third embodiment of the present invention, there is provided an information recording/reproducing apparatus comprising: means for recording, on a recording medium, information configured by sequencing a VFO pattern, a synchronous signal pattern for identifying the head of information and (1, 7)-modulated data; and means for reproducing the information recorded on the recording medium, wherein the VFO pattern consists of a repetitive pattern of "010", and the synchronous signal pattern is any one of the following patterns
"01001010010100101010100010010001000100" and
"01001010010100101010100010010010001".

In accordance with the first embodiment of the present invention, there is provided an information recording medium comprising: a VFO pattern recorded on a part of the medium and consisting of a repetitive pattern of "1000"; a synchronous signal pattern recorded subsequently to the VFO pattern and consisting of a binary signal pattern obtained by (2, 7)-modulating any one of hexadecimal notation representation signals such as "45A9F3"$_H$, "BE57F3"$_H$, "D4BA73"$_H$, "E527CF"$_H$ and "F949F3"$_H$; and (2, 7)-modulated data recorded subsequently to the synchronous signal pattern.

In accordance with the second embodiment of the present invention, there is provided an information recording medium comprising: a VFO pattern recorded on a part of the medium and consisting of a repetitive pattern of "100"; a synchronous signal pattern recorded subsequently to the VFO pattern and being any one of the following patterns
"1001000100010010101010100001001001001",
"1001010010100101000101010010010001001",
"1001010010100101010100010010001001" and
"0101010101001000100101001001001001001"; and (1, 7)-modulated data recorded subsequently to the synchronous signal pattern.

In accordance with the third embodiment of the present invention, there is provided an information recording medium comprising: a VFO pattern recorded on a part of the medium and consisting of a repetitive pattern of "010"; a synchronous signal pattern recorded subsequently to the VFO pattern and being any one of the following patterns
"01001010010100101010100010010001000100" and
"01001010010100101010100010010010001"; and (1, 7)-modulated data recorded subsequently to the synchronous signal pattern.

In accordance with the first embodiment of the present invention, there is provided an information transmitting method comprising steps of: forming information by sequencing a VFO pattern, a synchronous signal pattern for identifying the head of information and (1, 7)-modulated data; and transmitting the formed information, wherein the VFO pattern consists of a repetitive pattern of "100", and the synchronous signal pattern is any one of the following patterns "1001000100010010101010100001001001001",
"1001010010100101000101010010010001001",
"1001010010100101010100010010001001" and
"0101010101001000100101001001001001001".

In accordance with the second embodiment of the present invention, there is provided an information transmitting method comprising steps of: forming information by sequencing a VFO pattern, a synchronous signal pattern for identifying the head of information and (1, 7)-modulated data; and transmitting the formed information, wherein the VFO pattern consists of a repetitive pattern of "010", and the synchronous signal pattern is any one of the following patterns "0100101001010010101010001001000100" and "010010100101001010101000100010010001".

In accordance with the first embodiment of the present invention, there is provided an information transmitting apparatus comprising: means for transmitting information configured by sequencing a VFO pattern, a synchronous signal pattern for identifying the head of information and (1, 7)-modulated data; and means for receiving the information transmitted from the transmitting means, wherein the VFO pattern consists of a repetitive pattern of "100", and the synchronous signal pattern is any one of the following patterns "100100010001001010101010000100101001", "100101001010010100010101010010001001", "100101001010010101010001010001001" and "010101010010001001010100101001001001".

In accordance with the second embodiment of the present invention, there is provided an information transmitting apparatus comprising: means for transmitting information configured by sequencing a VFO pattern, a synchronous signal pattern for identifying the head of information and (1, 7)-modulated data; and means for receiving the information transmitted from the transmitting means, wherein the VFO pattern consists of a repetitive pattern of "010", and the synchronous signal pattern is any one of the following patterns "0100101001010010101010001001000100" and "010010100101001010101000100010010001".

BRIEF DESCRIPTION OF THE DRAWINGS

Other objects and advantages of the present invention will become apparent during the following discussion taken in conjunction with the accompanying drawings, in which:

FIGS. 9A through 9F are diagrams showing examples of the synchronous signal pattern determined by the method of the present invention;

DETAILED DESCRIPTION OF THE PREFERRED EMBODIMENT

A preferred embodiment of the present invention will hereinafter be described with reference to the accompanying drawings. In this embodiment, an obtainment of such a synchronous signal pattern as to satisfy the above-described conditions (1), (2) involves the steps of: determining a preceding VFO pattern beforehand; obtaining an output value of a matching filter in simulation; obtaining a difference in the output value between a timing when the output value reaches its maximum and a timing when a pre-existing output value reaches the second highest level; obtaining a difference between the maximum output value and the second highest output value with respect to samples of all the synchronous signal patterns by further repeating the simulations; and finding out such a synchronous signal pattern that the difference therebetween comes to the maximum.

Figure 3:
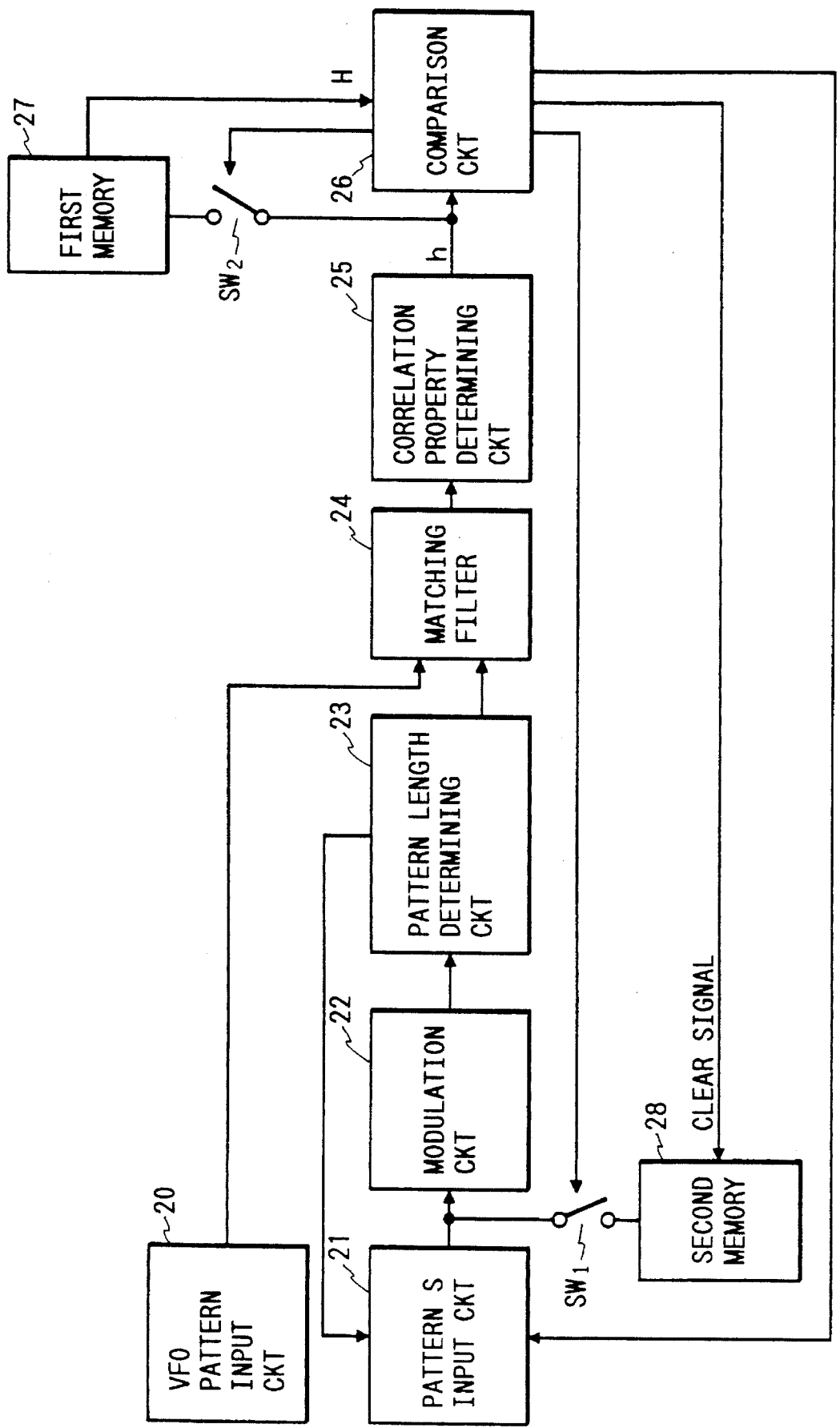
FIG. 3 is a block diagram illustrating a constructive example of an apparatus used for a method of determining a synchronous signal pattern according to the present invention.

FIG. 3 is a block diagram illustrating one embodiment of an apparatus employed for determining the synchronous signal pattern according to the present invention. Referring to FIG. 3, the reference numeral 20 designates a VFO pattern input circuit; 21 a pattern S input circuit; 22 a (2, 7) modulation circuit; 23 a pattern length determining circuit; 24 a matching filter; 25 a correlation property determining circuit; 26 a comparison circuit; 27 a first memory; and 28 a second memory. Further, the symbols $SW_1$, $SW_2$ represent switches.

Figure 4:
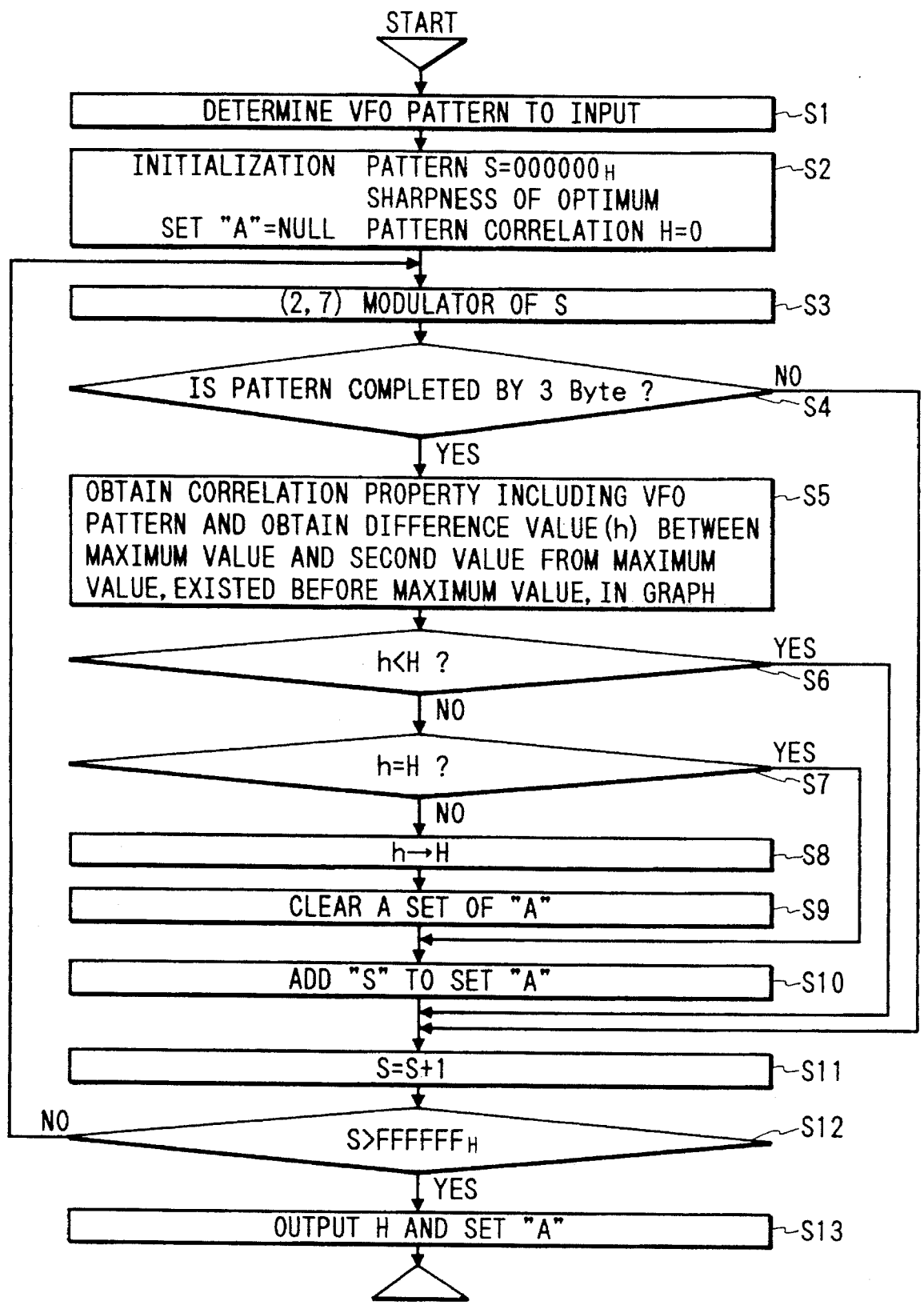
FIG. 4 is an explanatory flowchart showing one example of the method of determining the synchronous signal pattern according to the present invention.

FIG. 4 is a flowchart of assistance in explaining the method of determining the synchronous signal pattern according to the present invention which uses the apparatus of FIG. 3. In the following explanation, the symbol S indicates a sample of a synchronous signal pattern represented by a hexadecimal notation. The symbol H denotes a difference value between the maximum value of a correlation property and the second highest value existing before the maximum value, i.e., a sharpness of correlation in an optimum synchronous signal pattern. The symbol A shows a set of samples of the optimum synchronous signal pattern.

To start with, in step S1, the VFO pattern is determined. Employed in this embodiment is a 12-byte pattern wherein 4 bits of "1000" are repeated 48 times as the VFO pattern. This VFO pattern is inputted to the matching filter 24 from the VFO pattern input circuit 20.

Executed next in step S2 is initialization of $S=000000_H$ (the subscript H herein indicates a hexadecimal number), H=0 and A=null. More specifically, a sample outputted from the pattern S input circuit 21 is set to "000000"$_H$. Then, "0" is inputted to the first memory, while the second memory is cleared. Hereinafter, the pattern S input circuit 21 increments the pattern S by ones from "000000"$_H$ to "FFFFFF"$_H$. Every time a different sample is outputted from the pattern S input circuit the operations of steps S3–S11 are repeated, thereby determining the correlation property.

In step 83, the sample outputted from the pattern input circuit 21 undergoes (2, 7) modulation in the modulation circuit 22. This (2, 7)-modulated sample pattern is inputted to the pattern length determining circuit 23 in step S4. The pattern length determining circuit 23 determines whether or not the inputted pattern is completed by 3 bytes. If not completed by 3 bytes, this pattern is not transferred to the matching filter. Then, the operation proceeds to step S11, wherein an indication is given to the pattern S input circuit 21 to output the next sample. Namely, the samples that are excessive or short of characters in the (2, 7) modulation are not adopted as synchronous signal patterns. Returning to step S3, a test of the next sample is effected.

In step S4, if the result is "YES"—i.e., the sample pattern is completed by 3 bytes, the operation moves to step S5, wherein this sample pattern is inputted to the matching filter 24.

Step S4 is a necessary operation because of the (2, 7) modulation being based on a variable-length coding system. If a coding system other than the (2, 7) modulation is applied, step S4 is needed on a condition that the applied system is defined as a variable-length coding system.

In step S5, the correlation property is computed. The matching filter 24 used for computing this correlation is of such a type as to compute the most general and universal total bit correlation. To be specific, in this filter, all the bits of 3 bytes of the synchronous signal pattern after the (2, 7) modulation are compared, and time variations in the coincidence number are observed. Then, correlation values (matching filter output values) in 53 positions, wherein the starting point is a position in which the correlation with the VFO pattern is known serves as a starting point, viz., the position disposed 52 clocks (48+4) before DM (SYNC), while the terminal point is DM.

Obtained further in step S5 is a height difference h between a timing ("48" in the last) when the maximum correlation value is exhibited and a timing when the second highest correlation value is exhibited among the 53 positions of the thus formed graph.

Figure 5:
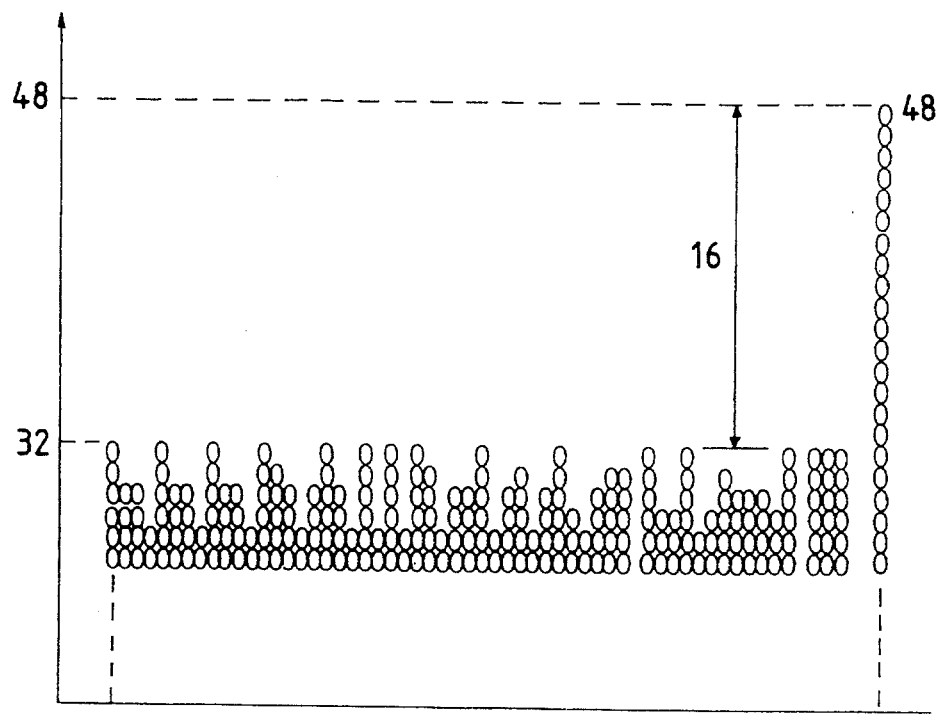
FIG. 5 is a correlation graph showing one example of the synchronous signal pattern determined by the method of the present invention.

FIG. 5 is a correlation graph in which the VFO pattern is a repetition of "1000", while the synchronous signal pattern is "BE57F3"$_H$. In the Figure, the axis of the ordinate indicates a degree of correlation. If this "BE57F3"$_H$ is subjected to the (2, 7) modulation, the result is "0100 1000 1000 0100 1001 0001 0010 0010 0010 0001 0000 1000". In FIG. 5, the timing when the maximum correlation value is the last timing, and a correlation value of this timing is "48". A correlation value of the timing when the second highest correlation value is exhibited at a timing before the last timing is "16". Hence, the difference h between the maximum correlation value and the second highest correlation value is a parameter representing an intensity of the correlation.

The timing when the maximum correlation value is shown is the last timing. The timing when the second highest correlation value is shown is set in terms of time before the timing when exhibiting the maximum correlation value. Tests after the last timing are thereby omitted, and the efficiency is improved, correspondingly.

Next, in step S6, the comparison circuit 26 compares the maximum value H of the correlation intensities obtained in the past with the value h outputted in step S5 from the correlation property determining circuit 25. If h<H, this sample is, it cannot be said, optimal as a synchronous signal pattern and therefore not adopted. The operation returns to step S3 after passing through steps S11, S12. To be specific, an indication signal is transmitted from the comparison circuit 26 to the pattern S input circuit 21. The pattern S input circuit 21 outputs the next sample. If judged as "NO" in step S6, the operation moves to step S7.

When h=H in step S7, it follows that this sample has the same correlation intensity as that of the optimum sample determined before it. Hence, the operation proceeds to step S10, wherein this sample is added to the set A. Namely, the switch SW$_1$ is closed in response to the indication signal from the comparison circuit, and this sample is additionally stored in the second memory.

If judged as "NO" in step S7—i.e., when h>H, it follows that this sample exhibits a larger correlation intensity than those of any samples determined before it. The operation therefore moves to step S8. In step S8, the value h representing the correlation intensity of this sample is newly inputted as H. Namely, the switch SW$_2$ is closed in accordance with the indication signal from the comparison circuit 26, and the value stored in the first memory 27 is replaced with the value h. Next, in step S9, the set A is cleared. More specifically, the second memory 28 is cleared in accordance with a clear signal given from the comparison circuit 26. Then, in step S10, this sample is stored in the second memory 28.

In steps described above, when inputting the sample pattern "000000"$_H$, H=0. Hence, the correlation intensity h of the sample pattern "000000"$_H$ is stored in the first memory 27, while the second memory 28 stores the sample pattern "000000"$_H$. Then, the determination on other samples are performed on the basis of this sample pattern "000000"$_H$ until the sample having the larger correlation intensity is inputted.

The operations of steps S3 to S11 are repeated until the sample pattern exceeds "FFFFFF"$_H$. If it is judged in step S12 that the sample pattern exceeds "FFFFFF"$_H$, the operation moves to step S13, wherein the correlation intensity H and a set A of the sample patterns are outputted from the first and second memories 27, 28. Some sample patterns outputted at this time are defined as patterns optimal to the synchronous signal pattern. Therefore, any one of the samples of the set A is determined as a synchronous signal pattern.

The description given so far has dealt with an example of determining the synchronous signal pattern by the apparatus depicted in FIG. 3. According to the present invention, however, it is also possible to effect a computer-assisted determination of the synchronous signal pattern by setting a program shown in FIG. 4 in the computer. On this occasion, a usually employed personal computer may suffice in terms of the scale of the computer.

If the VFO pattern is the repetition of "1000", the synchronous signal patterns obtained by the method discussed above may be the following five patterns:

| 45 | A9 | F3$_H$ |
| BE | 57 | F3$_H$ |
| D4 | BA | 73$_H$ |
| E5 | 27 | CF$_H$ |
| F9 | 49 | F3$_H$ |

All these five patterns are similar to each other. The pulse numbers thereof are all 12, and (d, k)=(2, 4). Namely, each pattern has the four shortest portions of d=2. Note that d represents the minimum number which permits a continuation of 0, and k indicates the maximum number. The sample pattern "BE57F3"$_H$ illustrated in FIG. 5 has the least continuation part of the shortest pattern among the five patterns.

Referring to FIG. 5, it can be understood that the difference between the maximum portion and the second highest portion in the graph is 16.

The present invention can be changed in a variety of forms within such a range that these variant forms do not depart from the gist thereof.

For instance, this embodiment has dealt with the case where the VFO pattern is "0100 1000 1000 0100 1001 0001 0010 0010 0010 0001 0000 1000". The present invention is, however, applicable to other VFO patterns. For example, it is assumed the VFO pattern is a repetition of "010".

Figure 1:
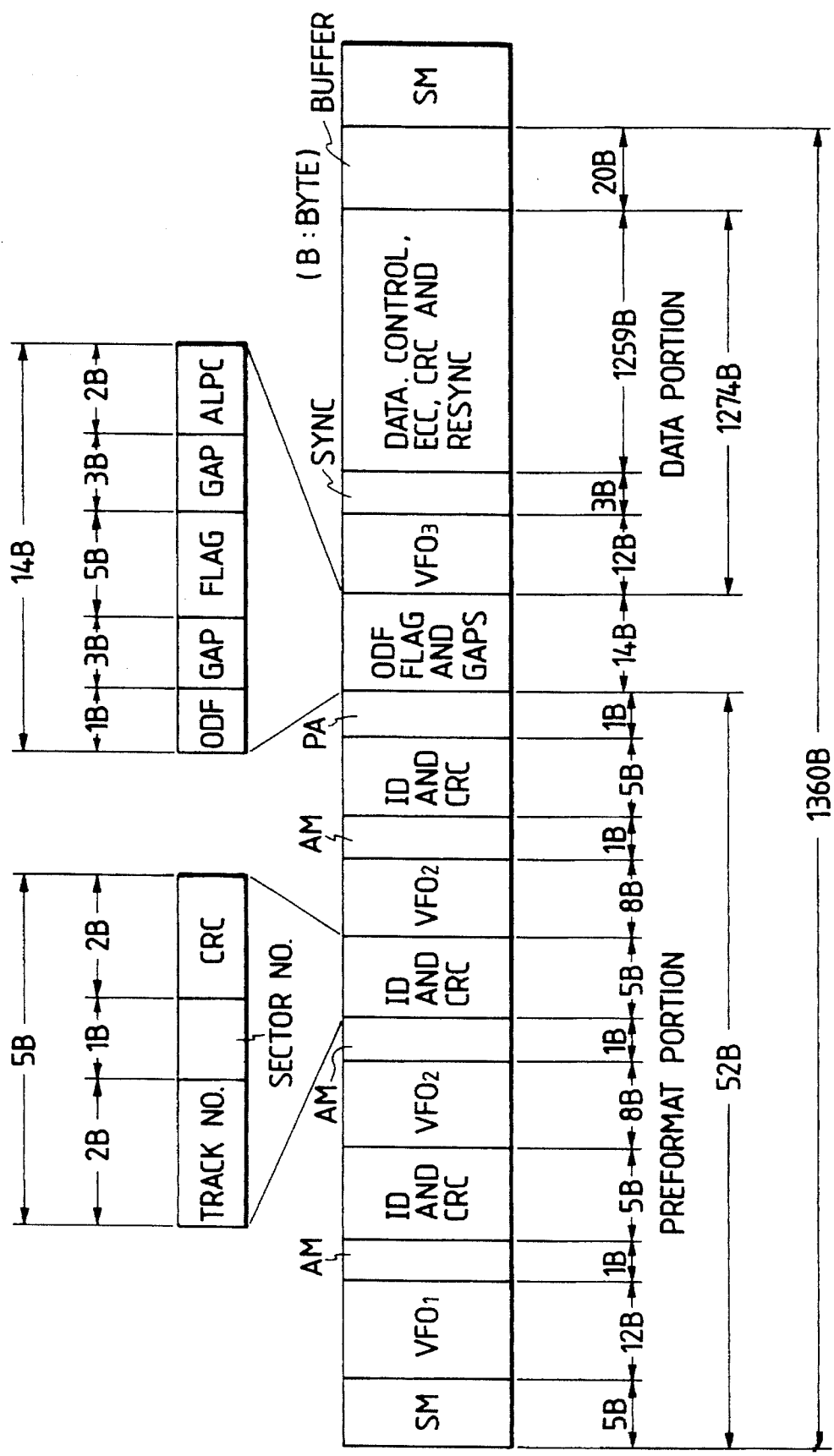
FIG. 1 is a schematic diagram showing one example of an ISO-standardized information format.

In the same program of FIG. 1 as that in the preceding example, the VFO pattern is conceived as a repetitive pattern of "010", and this pattern is inputted to perform the calculation.

Figure 7:
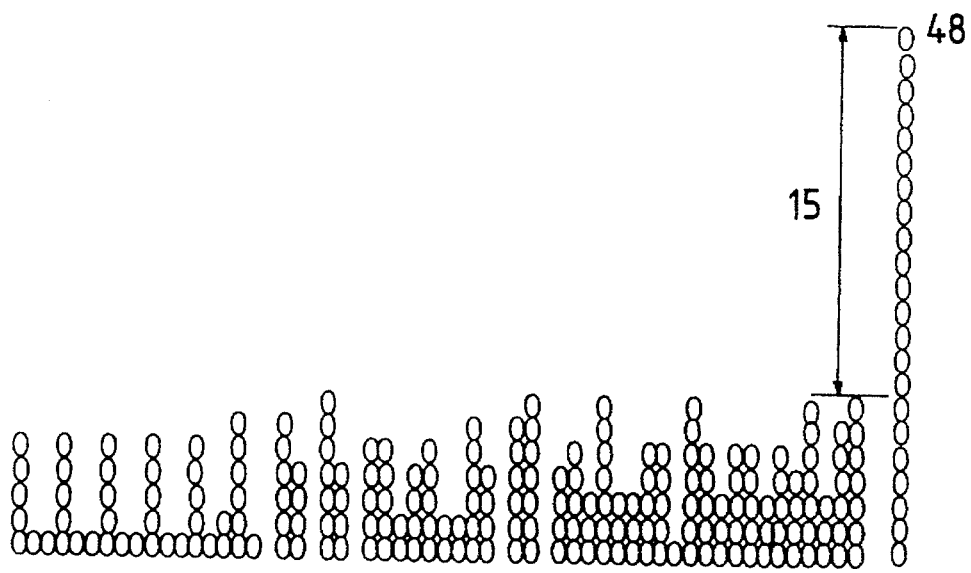
FIGS. 7 and 8 are correlation graphs showing other examples of the synchronous signal pattern determined by the method of the present invention.
Figure 8:
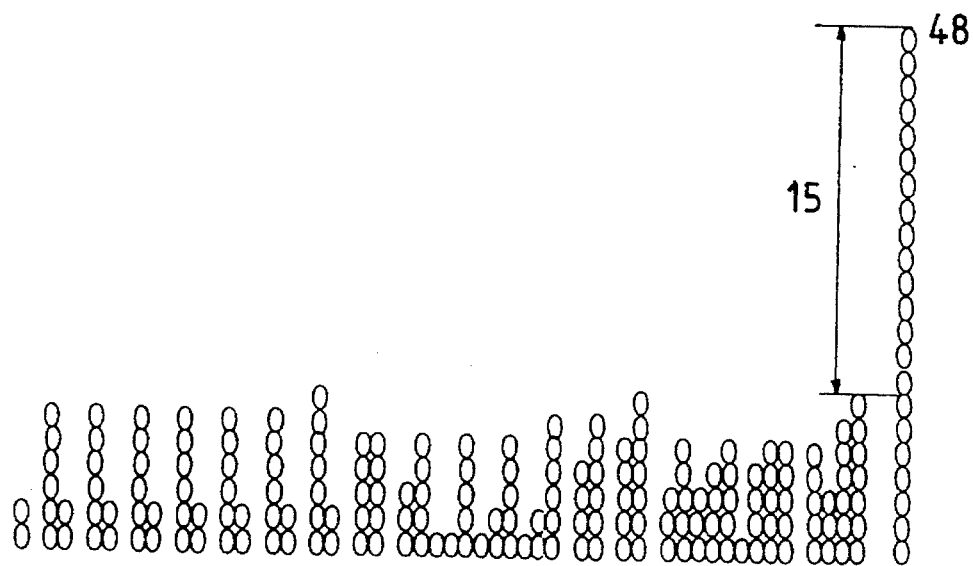

Consequently, H=15, and the number of the set A becomes 5234. In this connection, the minimum value of S becomes "00512B"$_H$, while the maximum value of S is "BFF9CB"$_H$. FIGS. 7 and 8 are correlation graphs of these respective values.

Figure 6:
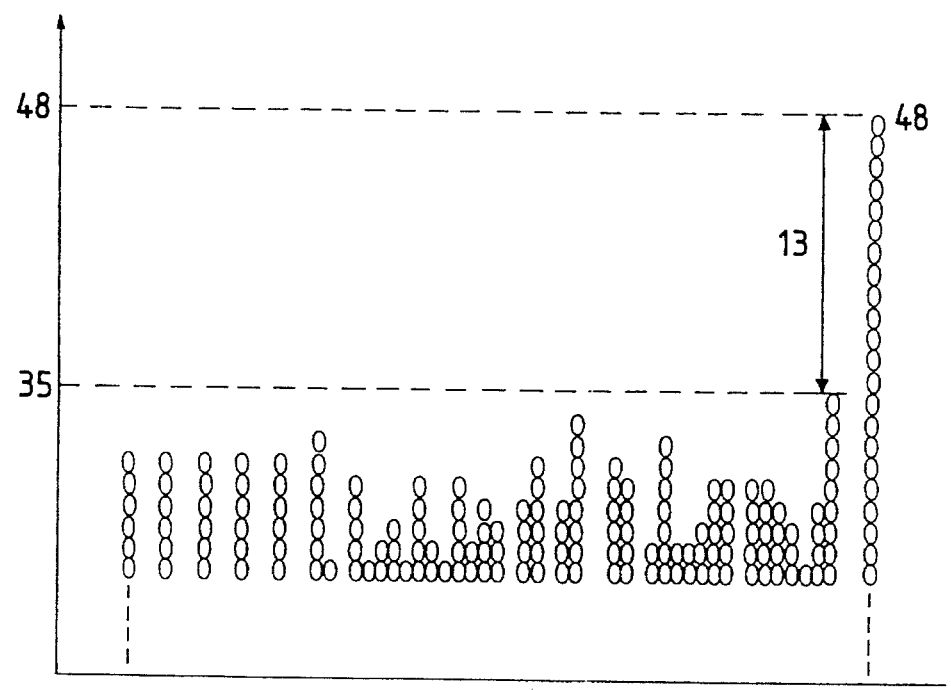
FIG. 6 is a correlation graph illustrating a conventional synchronous signal pattern.

For a comparison, FIG. 6 shows a correlation graph for a sample pattern which becomes "0100 0010 0100 0010 0010 0010 0100 0100 1000 0010 0100 1000" when the SYNC pattern is "89EACB"H, viz., when effecting the (2, 7) modulation, wherein the VFO pattern is the repetition of "010". This corresponds to the above-mentioned 5.25 in. WORM type or rewritable type ISO format. In the case of FIG. 6, the difference h between the maximum point and the second highest point is "13". As this numerical value h becomes smaller, the possibility of detecting an error of the synchronous signal pattern increases.

In each of the embodiments of FIGS. 7 and 8, it can be understood that the difference between the last maximum point and the second highest point is "15". In the pattern of FIG. 6, H=13, and it can be therefore determined from these graphs that each of the embodiments of FIGS. 7 and 8 is superior to that.

Further, patterns having the least number of pulses, e.g., 100 pulses are selected from 5234 patterns obtained and shown in FIGS. 9A to 9F. These patterns are numbered 385. Data words are shown in the left parts of FIGS. 9A to 9F, while the right parts thereof indicate patterns in which the data words are (2, 7)-modulated.

Besides, in the embodiments discussed above, the matching filter used for computing the correlation property comes under such a type as to compute the most general and universal total bit correlation. The method of obtaining the correlation according to the present invention is not, however, limited to this type. Namely, for instance, total bits are divided into a plurality of blocks, and a comparison is made for every block. It is also thinkable to employ a method of making the determination based on a threshold value in accordance with the coincidence block number. In this case, a time variation in the coincidence block number may be observed.

The description given so far has dealt with the embodiments in which the present invention is applied to the (2, 7) modulation. The present invention is, however, applicable to other modulation systems. The following is an explanation of an example where the present invention is applied to a (1, 7) modulation.

Figures 10, 11:
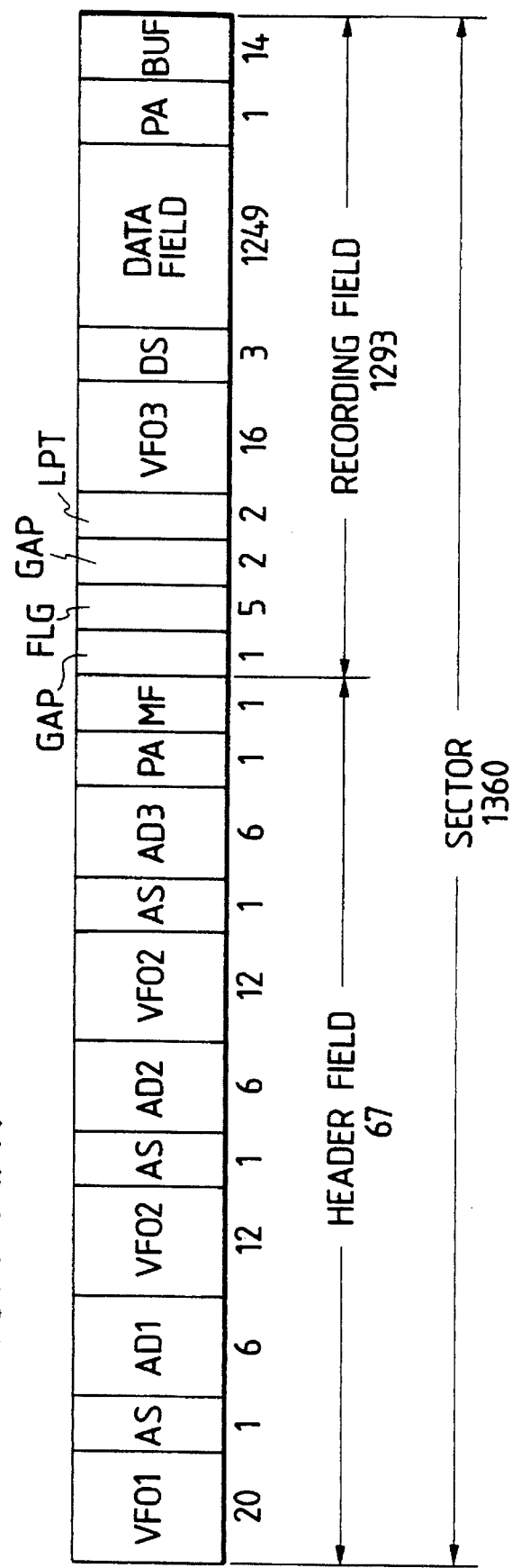
FIG. 10 is a chart showing one example of a code conversion table of (1, 7) RLL codes.
FIG. 11 is a chart showing one example of a sector format of a recording medium.

(1, 7) RLL (Run Length Limited) codes have hitherto been known as those used for a data coding system. FIG. 10 is a chart showing one example of a code conversion table of such (1, 7) RLL codes. Binary data of bits shown in the left column of the table are converted into data indicated by channel bits of the right column of the table by means of a coding circuit.

As described above, when recording the (1, 7) RLL coded data on a recording medium or transmitting such data, the data are divided into a plurality of sectors, and the synchronous patterns are added thereto. FIG. 11 is a chart illustrating one example of a format of such sectors. Shown in this example is a format where the data are recorded on the recording medium such as an optical disk or the like. Referring to FIG. 11, the numerals written under the respective blocks indicate the number of bytes. 1 byte—i.e., 8 bits—corresponds to 12 symbols (codes) in the (1, 7) codes.

The sector consists of a header field and a recording field. The header field contains an address, viz., an information ID. Further, a data field of the recording field shows the data to be recorded on the recording medium. In FIG. 11, the above-mentioned AD is marked with a symbol AD. VFO indicates a constant periodic pattern for synchronizing the clocks during reproduction. As (Address Sync.) and DS (Data Sync.) respectively represent synchronous signal patterns for recognizing the heads of the data and address. Further, PA denotes an area for storing extra characters in the (1, 7) code conversion. GAP and BUF designate areas in which nothing is recorded. An explanation of MF, FLG and LPT will be omitted, because these symbols are not associated directly with the present invention. A repetitive pattern of "100100100100" has hitherto been used as a VFO pattern. A pattern of "100010100100010100100001001010100000" has hitherto been also employed as a DS pattern. This DS pattern is obtained by (1, 7)-coding the 3-byte data of "659IE2"$_H$.

On the other hand, the information recorded on the medium in the above-described manner is reproduced by a reproducing means. The reproducing means includes a synchronous signal pattern detector. The synchronous pattern is detected by this detector, thereby recognizing the head position of the data. The data reproduction is thus started. This synchronous signal pattern detector has also, as explained earlier, the construction shown in, e.g., FIG. 2.

Figure 2:
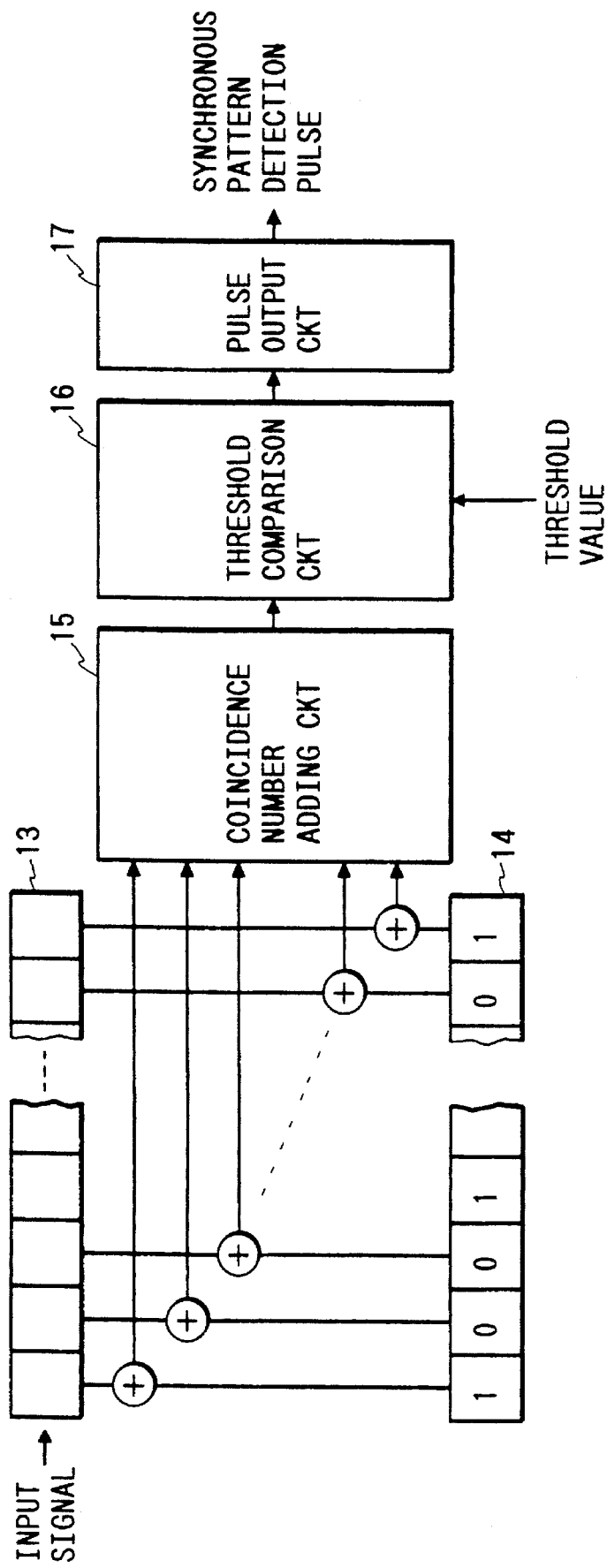
FIG. 2 is a block diagram illustrating a constructive example of a typically employed synchronous signal pattern detection circuit.
Figure 15:
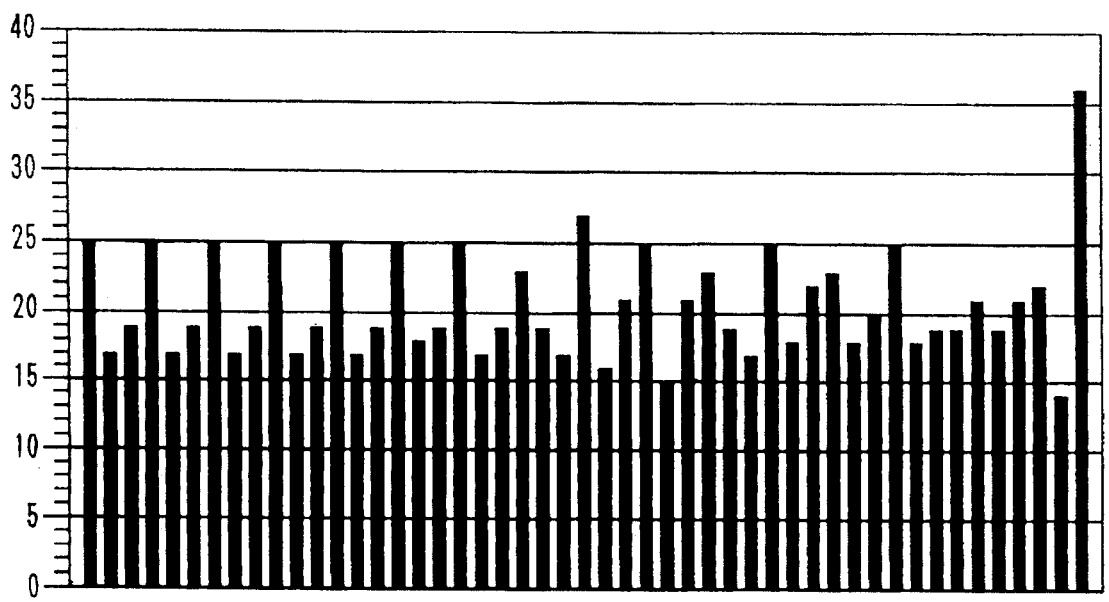
FIG. 15 is a correlation graph illustrating a conventional (1, 7)-modulated synchronous signal pattern.

FIG. 15 illustrates time variations in the output value of a coincidence number adding circuit 15 when the circuit depicted in FIG. 2 detects signals consisting of the VFO pattern composed of the repetitive pattern of "100" and the synchronous pattern of "100010100100010100100001001010100000". Referring to FIG. 15, the axis of abscissa indicates the time, while axis of ordinate indicates the output value of the coincidence number adding circuit 15. In FIG. 15, the rightmost bar is a correct detecting point of the synchronous pattern. Therefore, if a high correlation value part exists in the left of this bar, the possibility of causing the detection error increases, correspondingly.

In the following embodiment, the possibility of detecting an incorrect synchronous pattern is minimized by use of a combination of the synchronous pattern and VFO pattern exhibiting a good correlation property when employing the (1, 7) codes.

Figure 12:
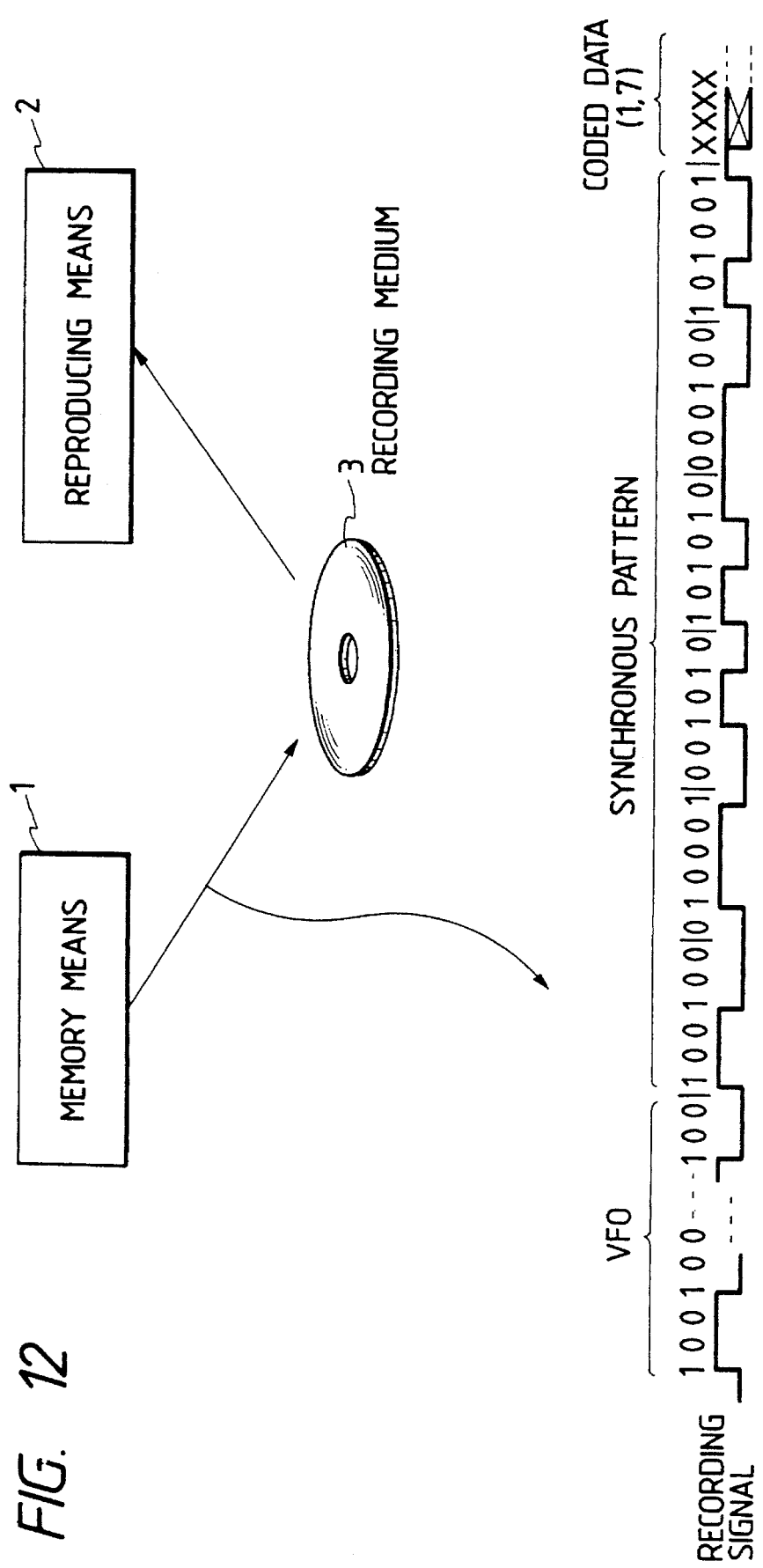
FIG. 12 is a conceptual diagram showing one example in which the present invention is applied to an information recording/reproducing apparatus.

FIG. 12 is a conceptual diagram depicting an information recording/reproducing apparatus to which the present invention is applied. Referring to FIG. 12, a recording means 1 records, on a recording medium 3, the information in which the VFO pattern, the synchronous signal pattern and the (1, 7) code data are sequenced. In accordance with this embodiment, the VFO pattern consists of a repetitive pattern of "100". Further, the synchronous pattern is composed of a pattern such as "100100001000100101010100000100101001". This synchronous pattern is obtained by (1, 7)-coding the 3-byte data of "53EC1F"$_H$. In this embodiment, the information is recorded based on an NRZI (Neon Return to Zero Inverted) system. However, an RZ (Return to Zero) system may also be used.

Figure 13:
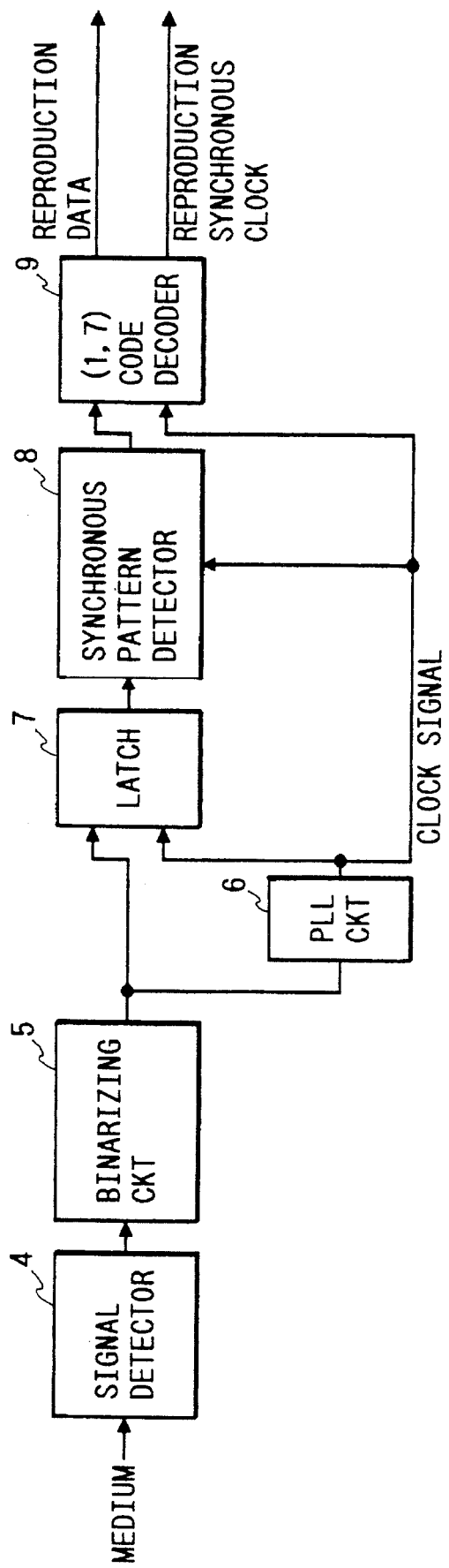
FIG. 13 is a block diagram depicting a constructive example of a reproducing means of FIG. 12.

The information recorded on the recording medium 3 is read by reproducing means 2, whereby reproduction data and reproduction synchronous clocks are reproduced. The reproducing means 2 is constructed as shown in a block diagram of, e.g., FIG. 13. Referring to FIG. 13, a signal detected by a signal detector 4 from a medium 3 is converted into a binary pulse signal by a binarizing circuit 5. This binary pulse signal is inputted to a phase locked loop (PLL) circuit 6, thereby generating a clock signal. On the other hand, an output of the binarizing circuit 5 is synchronized with the clock signal by a latch 7. A synchronous signal pattern is detected by a synchronous signal pattern detector 8. The synchronous signal pattern detector 8 has a construction shown in FIG. 2. When detection pulses are outputted from the synchronous signal pattern detector in the above-described procedures, the data subsequent to the synchronous signal pattern is decoded by a (1, 7) code decoder 9. Then, this decoder 9 outputs the reproduction data and the reproduction synchronous clocks.

Figure 14:
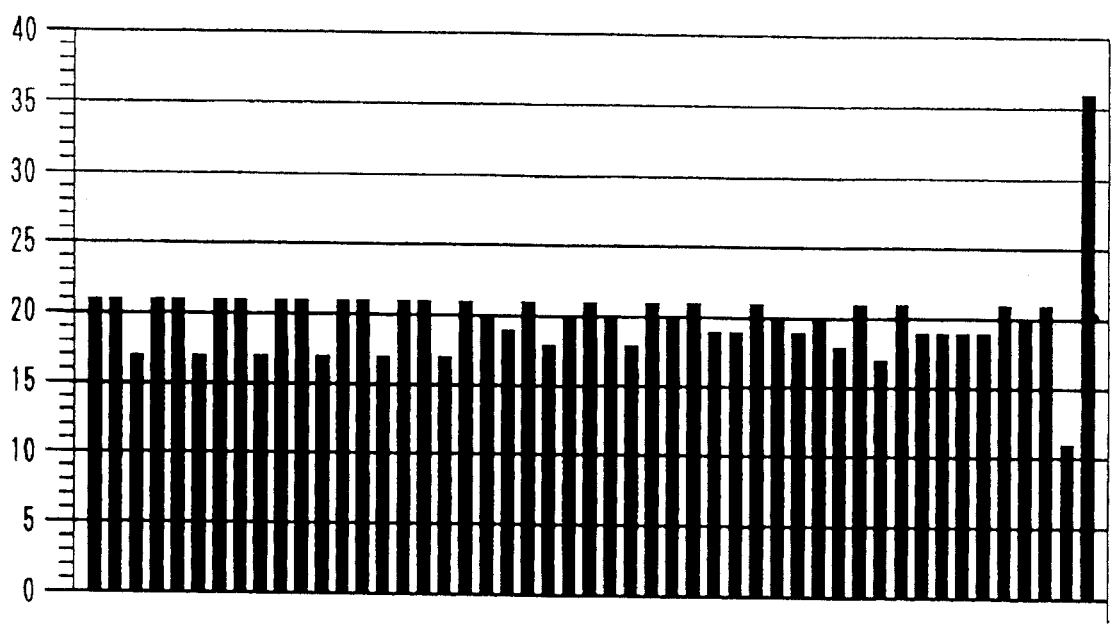
FIG. 14 is a correlation graph showing one example of the synchronous signal pattern in a case where the present invention is applied to (1, 7) modulation.

Herein, FIG. 14 illustrates time variations in the output value of the coincidence number adding circuit 15 of FIG. 2 when using the VFO pattern and the synchronous signal pattern in accordance with this embodiment. Referring to FIG. 14, the axis of abscissa indicates time, while the axis of ordinate indicates the output value of the coincidence number adding circuit 15. In FIG. 14, the rightmost bar is a correct detecting point of the synchronous signal pattern. A difference between this rightmost correlation value and the maximum correlation value at other points is 15. This value 15 can be conceived as a margin for an error of a threshold comparison circuit 16 shown in FIG. 2. More specifically, in this graph, the margin for the error of the threshold comparison circuit 16 increases with a larger difference in the correlation value between the rightmost point and other maximum correlation value points. The possibility to mistakenly detect the synchronous signal pattern is thereby reduced. Based on this fact, when comparing the conventional example shown in FIG. 15 with this embodiment, the difference in the correlation value is 9 in the conventional example. It can be known that the synchronous signal pattern is detectable more accurately in this embodiment than in the conventional example.

Figure 16:
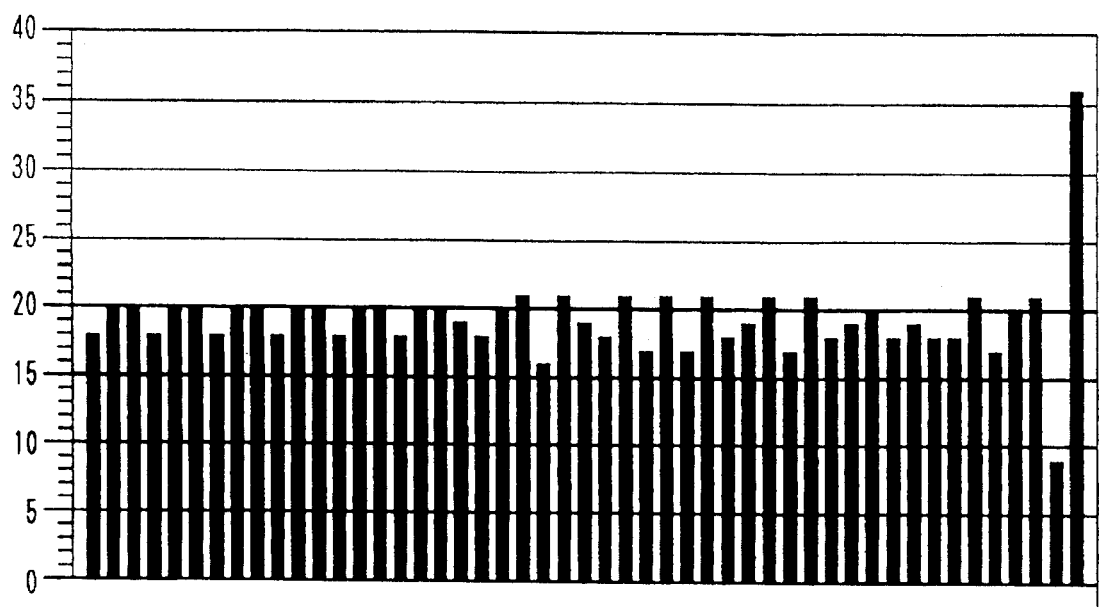
FIGS. 16 through 20 are correlation graphs showing other examples of the synchronous signal pattern in a case where the present invention is applied to (1, 7) modulation.

FIG. 16 is a chart illustrating the time variation in the correlation value in another embodiment of the present invention. The device, the reproducing means and the synchronous signal pattern detector in this embodiment are all constructed in the same way with the preceding embodiment.

In accordance with this embodiment, the VFO pattern consists of a repetitive pattern of "100". Further, the synchronous signal pattern is composed of a pattern such as "100101001010010100010101010010001001". As obvious from FIG. 16, in this embodiment also, a difference between the rightmost correlation value representing a correct detecting point of the synchronous signal pattern and the maximum correlation value at points other than this detecting point is 15. Hence, when using the synchronous signal pattern of this embodiment also, as in the same way with the preceding embodiment, there is obtained an effect to prevent the incorrect detection of the synchronous signal pattern.

Figure 17:
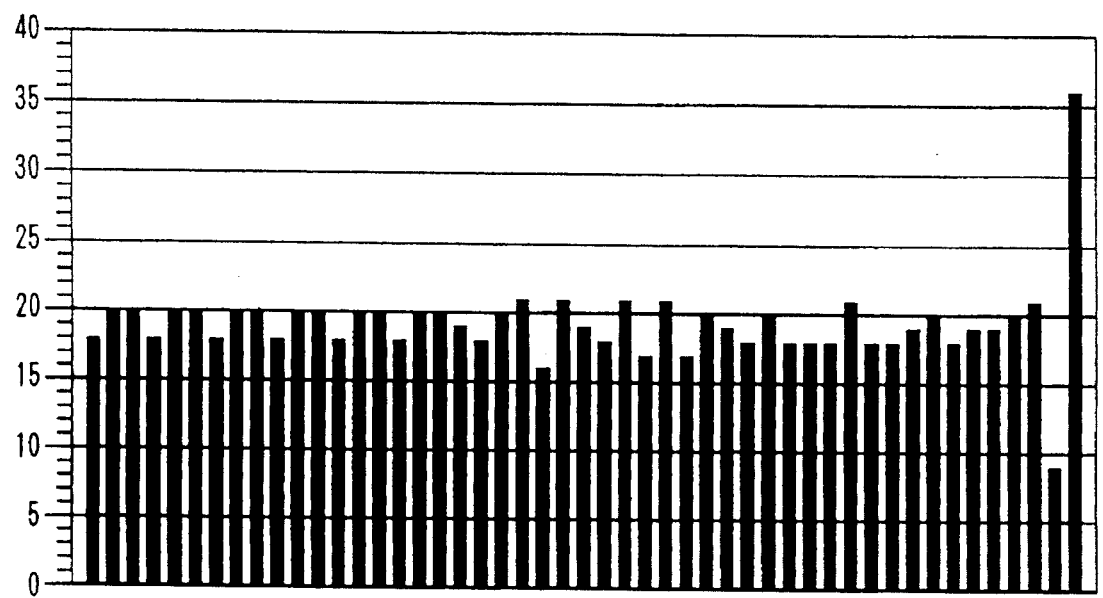

FIG. 17 is a chart showing the time variations in the correlation value in still another embodiment of the present invention. The device, the reproducing means and the synchronous signal pattern detector are all constructed in the same manner with the preceding embodiment.

In accordance with this embodiment, the VFO pattern consists of a repetitive pattern of "100". Further, the synchronous signal pattern is composed of a pattern such as "100101001010010101010100010010001001". As obvious from FIG. 17, in this embodiment also, a difference between the rightmost correlation value representing a correct detecting point of the synchronous signal pattern and the maximum correlation value at points other than this detecting point is 15. Hence, when using the synchronous signal pattern of this embodiment also, as in the same way with the preceding embodiment, there is obtained an effect to prevent the incorrect detection of the synchronous signal pattern.

Figure 18:
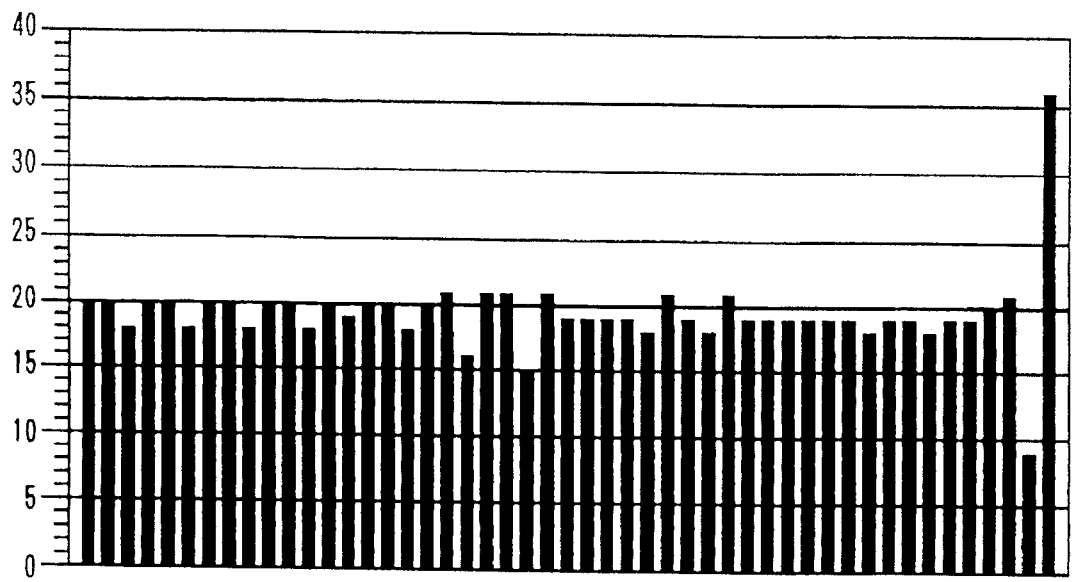

FIG. 18 is a chart showing the time variations in the correlation value in a further embodiment of the present invention. The device, the reproducing means and the synchronous signal pattern detector are all constructed in the same manner with the preceding embodiment.

In accordance with this embodiment, the VFO pattern consists of a repetitive pattern of "100". Further, the synchronous signal pattern is composed of a pattern such as "010101010010001001010010101001001001". As obvious from FIG. 18, in this embodiment also, a difference between the rightmost correlation value representing a correct detecting point of the synchronous signal pattern and the maximum correlation value at points other than this detecting point is 15. Hence, when using the synchronous signal pattern of this embodiment also, as in the same way with the preceding embodiment, there is obtained an effect to prevent the incorrect detection of the synchronous signal pattern.

Under such a condition that [the VFO pattern is a repetitive pattern of "100", while the synchronous pattern is a (1, 7)-coded pattern of 3 bytes], there exists no pattern exhibiting a more preferable correlation property than the four synchronous patterns shown in the embodiments of FIGS. 14 and 16 through 18.

If the VFO pattern is a repetitive pattern of "010", the synchronous pattern having a large difference between the correlation value at the point of detecting the most preferable, i.e., correct synchronous pattern and the maximum correlation value at other points is different from the pattern in the above-described embodiment. The following is a description of such another embodiment of the present invention.

Figure 19:
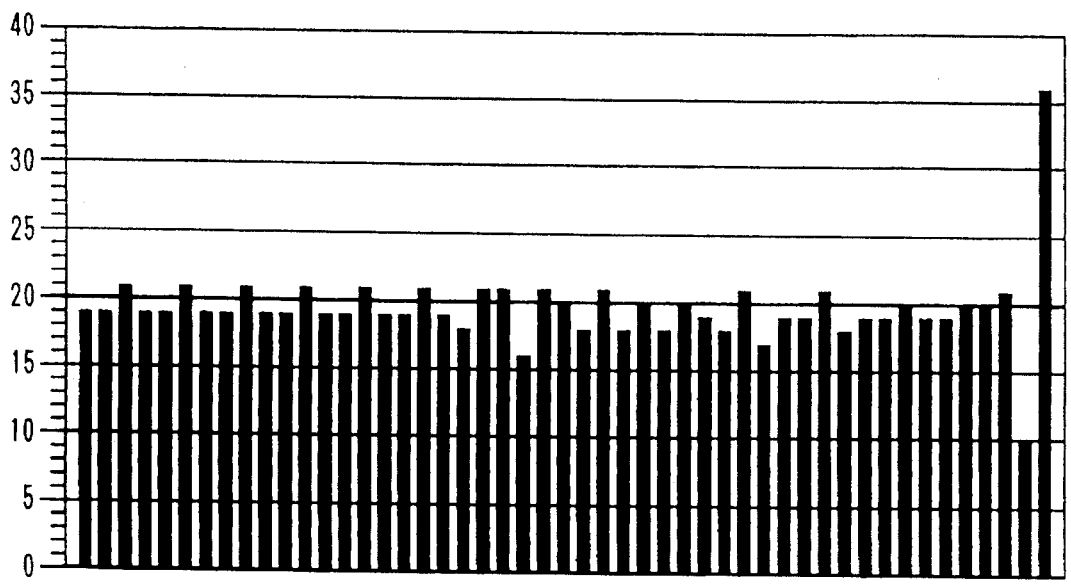

FIG. 19 is a chart showing the time variations in the correlation value in still a further embodiment of the present invention. The device, the reproducing means and the synchronous signal pattern detector are all constructed in the same manner with the preceding embodiment.

In accordance with this embodiment, the VFO pattern consists of a repetitive pattern of "010". Further, the synchronous signal pattern is composed of a pattern such as "010001001010010101010100010010001001000100". As seen from FIG. 19, in this embodiment also, a difference between the rightmost correlation value representing a correct detecting point of the synchronous signal pattern and the maximum correlation value at points other than this detecting point is 15. Hence, when using the synchronous signal pattern of this embodiment also, as in the same way with the preceding embodiment, there is obtained an effect to prevent the incorrect detection of the synchronous signal pattern.

Figure 20:
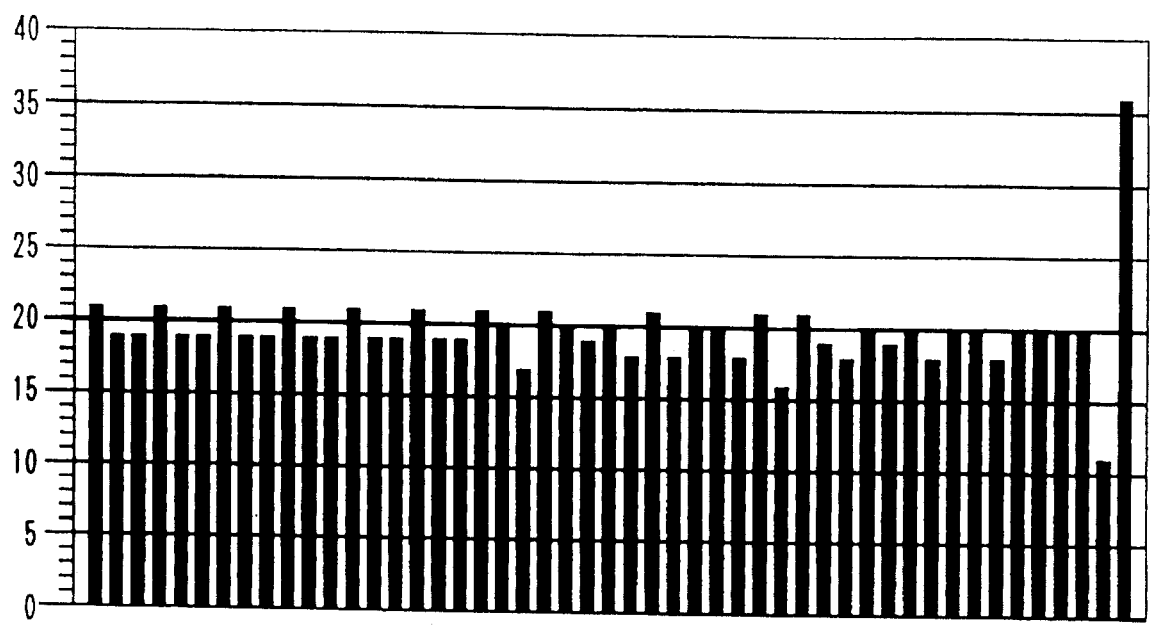

FIG. 20 is a chart showing the time variations in the correlation value in yet another embodiment of the present invention. The apparatus, the reproducing means and the synchronous signal pattern detector are all constructed in the same manner with the preceding embodiment.

In accordance with this embodiment, the VFO pattern consists of a repetitive pattern of "010". Further, the synchronous signal pattern is composed of a pattern such as "010010100101001010101000100010010001". As seen from FIG. 20, in this embodiment also, a difference between the rightmost correlation value representing a correct detecting point of the synchronous signal pattern and the maximum correlation value at points other than this detecting point is 15. Hence, when using the synchronous signal pattern of this embodiment also, as in the same way with the preceding embodiment, there is obtained an effect to prevent the incorrect detection of the synchronous signal pattern.

Under such a condition that [the VFO pattern is a repetitive pattern of "010", while the synchronous signal pattern is a (1, 7)-coded pattern of 3 bytes], there exists no pattern exhibiting a more preferable correlation property than the two synchronous patterns shown in the embodiments of FIGS. 19 and 20.

In the embodiments discussed above, DS (Data Sync.) added in front of the recording data is exemplified. The present invention is, however, also applicable to AS (Address Sync.) added in front of the address data. In this case, AS may be conceived as a 3-byte (1, 7) coded pattern.

The present invention is applicable to all apparatus for recording and reproducing the coded signals. For example, when the present invention is applied to an optomagnetic disk device, the recording medium 3 of FIG. 12 is an optomagnetic disk. The recording means 1 concretely corresponds to an optical head including an objective lens for condensing beams emitted from a semiconductor laser and a laser serving as a light source. Further, the signal detector 4 of the reproducing means 2 corresponds to a photo detector for receiving the reflected laser beams from the disk through an analyzer.

Figure 21:
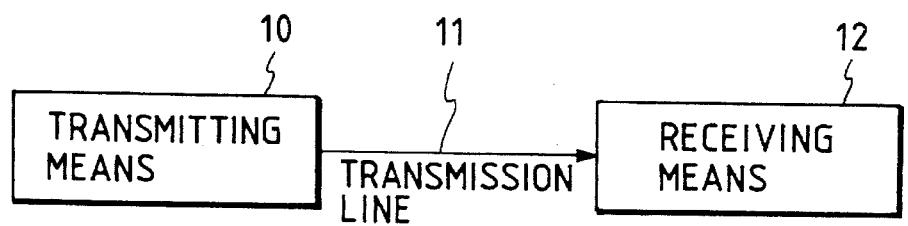
FIG. 21 is a conceptual diagram illustrating one example where the present invention is applied to an information transmitting device.

Besides, the present invention can be also applied to an information transmitting apparatus. FIG. 21 is a block diagram illustrating an embodiment wherein the present invention is applied to the information transmitting apparatus. In FIG. 21, transmitting means 10 transmits the information composed of a VFO pattern for synchronizing the clocks, a synchronous signal pattern for recognizing the signal head and (1, 7) RLL coded data. The transmitted signal is received by receiving means 12 via a transmission line 11. The receiving means 12 has the same construction with the reproducing means of FIG. 12—i,e., this is constructed as depicted in FIG. 13. Then, the receiving means 12 includes a synchronous pattern detector constructed of: a memory for storing the signal having the same pattern as the synchronous pattern; a circuit for comparing the synchronous pattern transmitted from the transmitting means with the pattern stored in the memory; a circuit for examining correlation values of the two patterns compared; and a circuit for outputting a signal indicating a detection of the synchronous pattern when the above-mentioned correlation value exceeds a predetermined value. Then, when detecting the synchronous pattern, the data subsequent thereto is received.

The transmitting apparatus described above also utilizes the same combination of the VFO pattern and the synchronous signal pattern as that in the embodiments of FIGS. 14 and 16 through 20. To be specific, when a repetitive pattern of "100" is employed as the VFO pattern transmitted from the transmitting means 10, the synchronous signal pattern involves the use of any one of patterns such as "100100010001001010101010000100101001", "100101001010010100010101010010001001", "100101001010010101010100010010001001" and "010101010100100010010100101001001001". Further, when a repetitive pattern of "010" is used as the VFO pattern transmitted from the transmitting means 10, the synchronous signal pattern involves the use of any one of patterns such as "010010100101001010101010001001000100"and "010010100101001010101000100010010001". Obtained also in this embodiment is the effect of minimizing the possibility in which the synchronous signal pattern detector mistakenly detects the synchronous signal pattern.

The present invention is applicable to all the apparatus for transmitting the coded signals. For instance, when the present invention is applied to an optical communication system, the transmission line 11 of FIG. 21 corresponds to an optical fiber. The transmitting means 10 concretely corresponds to an optical transmitter including a semiconductor laser serving as a light source and a modulation circuit. Further, the receiving means 12 corresponds to an optical receiver including a photo detector for receiving the light emerging from the optical fiber and a demodulation circuit.

The present invention is not limited to the embodiments discussed above but may be applied in many forms. Besides, the present invention includes all such applied examples without departing from the claims.

What is claimed is:

1. A method of determining an optimum synchronous signal pattern among samples of a plurality of synchronous patterns different from a predetermined VFO pattern in information configured by sequencing the VFO pattern, the synchronous signal pattern for identifying the head of information and the data, said method comprising the steps of:

inputting said VFO pattern and the respective samples of said synchronous signal pattern to a matching filter so as to detect correlation properties of said VFO pattern and said synchronous signal pattern with the matching filter; and determining the sample exhibiting an excellent correlation property as said synchronous signal pattern among said samples.

2. An information recording method comprising the steps of:

forming information by sequencing said VFO pattern, said synchronous signal pattern determined by said method of claim 1 and (2, 7)-modulated data; and recording the thus formed information on a recording medium.

3. A method of determining an optimum synchronous signal pattern among samples of a plurality of synchronous patterns different from a predetermined VFO pattern in information configured by sequencing the VFO pattern, the synchronous signal pattern for identifying the head of information and the data, said method comprising the steps of:

inputting said VFO pattern and said samples of said synchronous signal pattern to a matching filter;

obtaining a difference between a maximum output value of said matching filter and the second highest value before outputting said maximum value with respect to each of said samples;

comparing said output value differences obtained corresponding to said samples; and determining the sample having a maximum difference between said output values as said synchronous signal pattern.

4. An information recording method comprising the steps of:

forming information by sequencing said VFO pattern, said synchronous signal pattern determined by said method of claim 3 and (2, 7)-modulated data; and recording the thus formed information on a recording medium.

5. A method of determining an optimum synchronous signal pattern among samples of a plurality of synchronous patterns different from a predetermined VFO pattern in information configured by sequencing the VFO pattern, the synchronous signal pattern for identifying the head of information and the data, said method comprising the steps of:

(a) inputting said VFO pattern to a matching filter;

(b) inputting one of said samples of said plurality of synchronous signal patterns to said matching filter;

(c) obtaining correlation properties of said samples of said inputted VFO pattern and said synchronous signal pattern with said matching filter;

(d) obtaining a difference value between a maximum value of said correlation properties obtained in said step (c) and the second highest value existing before a maximum value exhibiting point;

(e) storing said difference value obtained in said step (d) in a first memory;

(f) storing said sample of said synchronous signal pattern inputted in said step (b) in a second memory;

(g) inputting to said matching filter said sample of said synchronous signal pattern different from said sample previously inputted;

(h) obtaining correlation properties of said sample of said synchronous signal pattern inputted in said step (g) and said VFO pattern with said matching filter;

(i) obtaining a difference value between a maximum value of said correlation properties obtained in said step (h) and the second highest value existing before said maximum value exhibiting point;

(j) comparing said difference value obtained in said step (i) and said difference value stored in said memory;

(k) replacing said difference value stored in said first memory with said difference value obtained in said step (i) if said difference value obtained in said step (i) is larger than said difference value stored in said memory as a result of said comparison, clearing said sample of said synchronous signal pattern previously stored in said second memory and storing said sample of said synchronous signal pattern inputted in said step (g) in said second memory;

(l) additionally storing said sample of said synchronous signal pattern inputted in said step (g) in said second memory without clearing said sample of said synchronous signal pattern previously stored in said second memory if said difference value obtained in said step (i) is equal to said difference value stored in said memory as a result of said comparison;

(m) repeating said steps (g) to (l) until all said samples are inputted to said matching filter; and (n) determining said sample stored in said second memory as said synchronous signal pattern.

6. An information recording method comprising the steps of:

forming information by sequencing said VFO pattern, said synchronous signal pattern determined by said method of claim 5 and (2, 7)-modulated data; and recording the thus formed information on a recording medium.

7. An information recording method comprising the steps of:

forming information by sequencing a VFO pattern, a synchronous signal pattern for identifying the head of information and (2, 7)-modulated data, said VFO pattern consisting of a repetitive pattern of "1000", and said synchronous signal pattern being a binary signal pattern obtained by (2, 7)-modulating a hexadecimal representation signal selected in relation to said VFO pattern, the selected hexadecimal representation signal being any one of hexadecimal representation signals "45A9F3"$_H$, "BE57F3"$_H$, "D4BA73"$_H$, "E527CF"$_H$ and "F949F3"$_H$; and recording on a recording medium the information formed in said forming step, which comprises said VFO pattern, said synchronous signal pattern, and the modulated data.

8. An information recording/reproducing apparatus comprising:

means for recording, on a recording medium, information configured by sequencing a VFO pattern, a synchronous signal pattern for identifying the head of information and (2 7)-modulated data, said VFO pattern consisting of a repetitive pattern of "1000", and said synchronous signal pattern being a binary signal pattern obtained by (2, 7)-modulating a hexadecimal representation signal selected in relation to said VFO pattern, the selected hexadecimal representation signal being any one of hexadecimal representation signals "45A9F3"$_H$, "BE57F3"$_H$, "D4BA73"$_H$, "E527CF"$_H$ and "F949F3"$_H$; and means for reproducing the information recorded on said recording medium, which comprises said VFO pattern, said synchronous signal pattern, and the modulated data.

9. An information recording/reproducing apparatus according to claim 8, further comprising a memory for storing the same pattern as said synchronous signal pattern, means for comparing said synchronous signal pattern in said information reproduced by said reproducing means with said pattern stored in said memory, a correlation value detection circuit for examining correlation values of said two patterns compared and a signal output circuit for outputting a signal indicating a detection of said synchronous signal pattern when said correlation value detected by said correlation value detection circuit exceeds a threshold value.

10. A machine-readable information recording medium for storing recorded data and having a predetermined pattern structure including a VFO pattern and a synchronous signal pattern for use by a reproducing apparatus in reproducing the recorded data, said recording medium comprising:

said VFO pattern, recorded on a part of said medium, and consisting of a repetitive pattern of "1000";

said synchronous signal pattern, recorded subsequently to said VFO pattern, and consisting of a binary signal pattern obtained by (2, 7)-modulating a hexadecimal representation signal selected in relation to said VFO pattern, the hexadecimal representation signal being any one of hexadecimal representation signals such as "5A9F3"$_H$, "BE57F3"$_H$, "D4BA73"$_H$, "E527CF"$_H$ and "F949F3"$_H$; and (2, 7)-modulated data recorded subsequently to said synchronous signal pattern.

11. An information recording method comprising the steps of:

forming information by sequencing a VFO pattern, a synchronous signal pattern for identifying the head of information and (1, 7)-modulated data, said VFO pattern consisting of a repetitive pattern of "100", and said synchronous signal pattern being selected in relation to said VFO pattern, said synchronous signal pattern being any one of the following patterns
a"1001000100010010101010100001010101001",
"1001010010100101000101010101010010001001",
"1001010010100101010101000100010001001" and
"0101010101001000100101001010010010001001"; and recording on a recording medium the information formed in said forming step which, comprises said VFO pattern, said synchronous signal pattern, and the modulated data.

12. An information recording/reproducing apparatus comprising:

means for recording, on a recording medium, information configured by sequencing a VFO pattern, a synchronous signal pattern for identifying the head of information and (1, 7)-modulated data, said VFO pattern consisting of a repetitive pattern of "100", and said synchronous signal pattern being selected in relation to said VFO pattern, said synchronous signal pattern being any one of the following patterns
"1001000100010010101010100001010101001",
"1001010010100101000101010101010010001001",
"1001010010100101010101000100010001001" and
"0101010101001000100101001010010010001001"; and means for reproducing the information recorded on said recording medium, which comprises said VFO pattern, said synchronous signal pattern, and the modulated data.

13. An information recording/reproducing apparatus according to claim 12, further comprising a memory for storing the same pattern as said synchronous signal pattern, means for comparing said synchronous signal pattern in said information reproduced by said reproducing means with said pattern stored in said memory, a correlation value detection circuit for examining correlation values of said two patterns compared and a signal output circuit for outputting a signal indicating a detection of said synchronous signal pattern when said correlation value detected by said correlation value detection circuit exceeds a threshold value.

14. A machine-readable information recording medium for storing recorded data and having a predetermined pattern structure including a VFO pattern and a synchronous signal pattern for use by a reproducing apparatus in reproducing the recorded data, said recording medium comprising:

said VFO pattern, recorded on a part of said medium, and consisting of a repetitive pattern of "100";

said synchronous signal pattern, recorded subsequently to said VFO pattern and selected in relation to said VFO pattern, said synchronous signal pattern being any one of the following patterns
"1001000100010010101010100001010101001",
"1001010010100101000101010101010010001001",
"1001010010100101010101000100010001001" and
"0101010101001000100101001010010010001001"; and (1, 7)-modulated data recorded subsequently to said synchronous signal pattern.

15. An information transmitting method comprising the steps of:

forming information by sequencing a VFO pattern, a synchronous signal pattern for identifying the head of information and (1, 7)-modulated data, said VFO pattern consisting of a repetitive pattern of "100", and said synchronous signal pattern being selected in relation to said VFO pattern, said synchronous signal pattern being any one of the following patterns
"1001000100010010101010100001010101001",
"1001010010100101000101010101010010001001",
"1001010010100101010101000100010001001" and
"0101010101001000100101001010010010001001"; and transmitting the information formed in said forming step, which comprises said VFO pattern, said synchronous signal pattern, and the modulated data.

16. An information transmitting device comprising:

means for transmitting information configured by sequencing a VFO pattern, a synchronous signal pattern for identifying the head of information and (1, 7)-modulated data, said VFO pattern consisting of a repetitive pattern of "100", and said synchronous signal pattern being selected in relation to said VFO pattern, said synchronous signal pattern being any one of the following patterns
"1001000100010010101010100001010101001",
"1001010010100101000101010101010010001001",
"1001010010100101010101000100010001001" and
"0101010101001000100101001010010010001001"; and means for receiving the information transmitted from said transmitting means, which comprises said VFO pattern, said synchronous signal pattern, and the modulated data.

17. An information recording/reproducing apparatus according to claim 16, further comprising a memory for storing the same pattern as said synchronous signal pattern, means for comparing said synchronous signal pattern in said information received by said receiving means with said pattern stored in said memory, a correlation value detection circuit for examining correlation values of said two patterns compared and a signal output circuit for outputting a signal indicating a detection of said synchronous signal pattern when said correlation value detected by said correlation value detection circuit exceeds a threshold value.

18. An information recording method comprising the steps of:

forming information by sequencing a VFO pattern, a synchronous signal pattern for identifying the head of information and (1, 7)-modulated data, said VFO pattern consisting of a repetitive pattern of "010", and said synchronous signal pattern being selected in relation to said VFO pattern, said synchronous signal pattern being any one of the following patterns
"01001010010100101010101000100100100" and
"01001010010100101010100010010001001"; and recording on a recording medium the information formed in said forming step, which comprises said VFO pattern, said synchronous signal pattern, and the modulated data.

19. An information recording/reproducing apparatus comprising:

means for recording, on a recording medium, information configured by sequencing a VFO pattern, a synchronous signal pattern for identifying the head of information and (1, 7)-modulated data, said VFO pattern consisting of a repetitive pattern of "010", and said synchronous signal pattern being selected in relation to said VFO pattern, said synchronous signal pattern being any one of the following patterns
"01001010010100101010101000100100100" and
"01001010010100101010100010010001001"; and means for reproducing the information recorded on said recording medium, which comprises said VFO pattern, said synchronous signal pattern, and the modulated data.

20. An information recording/reproducing apparatus according to claim 19, further comprising a memory for storing the same pattern as said synchronous signal pattern, means for comparing said synchronous signal pattern in said information reproduced by said reproducing means with said pattern stored in said memory, a correlation value detection circuit for examining correlation values of said two patterns compared and a signal output circuit for outputting a signal indicating a detection of said synchronous signal pattern when said correlation value detected by said correlation value detection circuit exceeds a threshold value.

21. A machine-readable information recording medium for storing recorded data and having a predetermined pattern structure including a VFO pattern and a synchronous signal pattern for use by a reproducing apparatus in reproducing the recorded data, said recording medium comprising:

said VFO pattern, recorded on a part of said medium, and consisting of a repetitive pattern of "010";

said synchronous signal pattern, recorded subsequently to said VFO pattern, and selected in relation to said VFO pattern, said synchronous signal pattern being any one of the following patterns
"0100101001010010101010001001000100" and
"0100101001010010101010001000100010001"; and (1, 7)-modulated data recorded subsequently to said synchronous signal pattern.

22. An information transmitting method comprising the steps of:

forming information by sequencing a VFO pattern, a synchronous signal pattern for identifying the head of information and (1, 7)-modulated data, said VFO pattern consisting of a repetitive pattern of "010", and said synchronous signal pattern being selected in relation to said VFO pattern, said synchronous signal pattern being any one of the following patterns
"0100101001010010101010001001000100" and
"0100101001010010101010001000100010001"; and transmitting the information formed in said forming step, which comprises said VFO pattern, said synchronous signal pattern, and the modulated data.

23. An information transmitting apparatus comprising:

means for transmitting information configured by sequencing a VFO pattern, a synchronous signal pattern for identifying the head of information and (1,7)-modulated data, said VFO pattern consisting of a repetitive pattern of "010", and said synchronous signal pattern being selected in relation to said VFO pattern, said synchronous signal pattern being any one of the following patterns
"0100101001010010101010001001000100" and
"0100101001010010101010001000100010001"; and means for receiving the information transmitted from said transmitting means, which comprises said VFO pattern, said synchronous signal pattern, and the modulated data.

24. An information recording/reproducing apparatus according to claim 23, further comprising a memory for storing the same pattern as said synchronous signal pattern, means for comparing said synchronous signal pattern in said information received by said receiving means with said pattern stored in said memory, a correlation value detection circuit for examining correlation values of said two patterns compared and a signal output circuit for outputting a signal indicating a detection of said synchronous signal pattern when said correlation value detected by said correlation value detection circuit exceeds a threshold value.

* * * * *

UNITED STATES PATENT AND TRADEMARK OFFICE
CERTIFICATE OF CORRECTION

PATENT NO. : 5,541,960
DATED : July 30, 1996
INVENTOR(S) : Seiichiro SATOMURA, et al.

It is certified that error appears in the above-indentified patent and that said Letters Patent is hereby corrected as shown below:

ON THE COVER PAGE:

Under item [54] - Title:

Line 2, "SYSCHRONOUS" should read --SYNCHRONOUS--.

Under item [57] "ABSTRACT":

Line 20, " "0000" " should read --"1000"--.

IN THE DISCLOSURE:

COLUMN 1:

Line 2, "SYSCHRONOUS" should read --SYNCHRONOUS--.

COLUMN 5:

Line 28, "pattern" (first occurrence) should read --pattern,--.

UNITED STATES PATENT AND TRADEMARK OFFICE
CERTIFICATE OF CORRECTION

PATENT NO. : 5,541,960
DATED : July 30, 1996
INVENTOR(S) : Seiichiro SATOMURA, et al.

It is certified that error appears in the above-indentified patent and that said Letters Patent is hereby corrected as shown below:

COLUMN 15:

Line 50, "i,e.," should read --i.e.,--.

COLUMN 18:

Line 62, " "5A9F3"$_H$, " should read --"45A9F3"$_H$.--

Signed and Sealed this

Twenty-fourth Day of December, 1996

Attest:

BRUCE LEHMAN

*Attesting Officer*    *Commissioner of Patents and Trademarks*